(12) United States Patent
Matsuoka et al.

(10) Patent No.: US 8,740,481 B2
(45) Date of Patent: *Jun. 3, 2014

(54) COATING AND DEVELOPING APPARATUS

(71) Applicant: Tokyo Electron Limited, Tokyo (JP)

(72) Inventors: Nobuaki Matsuoka, Koshi (JP); Akira Miyata, Koshi (JP); Shinichi Hayashi, Koshi (JP); Suguru Enokida, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/967,485

(22) Filed: Aug. 15, 2013

(65) Prior Publication Data
US 2013/0329199 A1 Dec. 12, 2013

Related U.S. Application Data

(63) Continuation of application No. 13/178,037, filed on Jul. 7, 2011, now Pat. No. 8,534,936.

(30) Foreign Application Priority Data

Jul. 9, 2010 (JP) ................................. 2010-156563
Mar. 10, 2011 (JP) ................................. 2011-053370

(51) Int. Cl.
*G03D 5/00* (2006.01)
*G03B 27/52* (2006.01)
*B05C 11/02* (2006.01)
*B05C 13/02* (2006.01)
*G03F 7/20* (2006.01)
*H01L 21/67* (2006.01)

(52) U.S. Cl.
CPC ............ *G03F 7/708* (2013.01); *H01L 21/6715* (2013.01)
USPC .................. 396/611; 355/27; 118/52; 118/66

(58) Field of Classification Search
USPC .......... 396/611; 355/27; 118/52, 66; 700/121
See application file for complete search history.

(56) References Cited

U.S. PATENT DOCUMENTS

| | | | |
|---|---|---|---|
| 7,379,785 B2 | 5/2008 | Higashi et al. | |
| 7,645,081 B2 | 1/2010 | Hara et al. | |
| 7,661,894 B2 | 2/2010 | Matsuoka et al. | |
| 8,534,936 B2 * | 9/2013 | Matsuoka et al. | 396/611 |
| 2008/0014333 A1 | 1/2008 | Matsuoka et al. | |
| 2008/0299502 A1 | 12/2008 | Shin et al. | |

FOREIGN PATENT DOCUMENTS

JP 2007-115831 A1 5/2007

OTHER PUBLICATIONS

Singaporean Office Action dated Mar. 18, 2013.

* cited by examiner

*Primary Examiner* — Rochelle-Ann J Blackman
(74) *Attorney, Agent, or Firm* — Burr & Brown, PLLC

(57) ABSTRACT

A coating and developing apparatus includes a processing block having at least one coating film-forming unit block stack and a vertically stacked developing unit block stack. Each unit block stack includes vertically stacked unit blocks, and each unit block includes processing modules containing liquid processing modules and heating modules. Each unit block includes a transport mechanism moveable along a transport passage from a carrier block side to an interface block side, to transport a substrate between the processing modules belonging to the unit block. Transfer units are provided on the carrier block sides of the coating film-forming unit blocks and the developing unit blocks respectively, for transferring a substrate to and from the transport mechanism of the associated coating film-forming or developing unit blocks. A first transfer mechanism transfers a substrate removed from a carrier to one of the transfer units associated with the coating film-forming unit blocks.

10 Claims, 21 Drawing Sheets

| | ADH | BCT | HP100~HP209 | COT | HP100~HP209 | WEE | TCT | HP300~HP411 | BST |
|---|---|---|---|---|---|---|---|---|---|
| WAFER A1 | 1 | 1 | 100 | 1 | 101 | 1 | 1 | 300 | 1 |
| WAFER A2 | 3 | 3 | 200 | 3 | 201 | 3 | 3 | 400 | 3 |
| WAFER A3 | 2 | 2 | 102 | 2 | 103 | 2 | 2 | 301 | 2 |
| WAFER A4 | 4 | 4 | 202 | 4 | 203 | 4 | 4 | 401 | 4 |
| WAFER A5 | 1 | 1 | 104 | 1 | 105 | 1 | 1 | 302 | 1 |
| WAFER A6 | 3 | 3 | 204 | 3 | 205 | 3 | 3 | 402 | 3 |
| --- | --- | --- | --- | --- | --- | --- | --- | --- | --- |

| | HP500~HP611 | DEV1~DEV8 | HP500~HP611 |
|---|---|---|---|
| WAFER A1 | 500 | 1 | 501 |
| WAFER A2 | 600 | 5 | 601 |
| WAFER A3 | 502 | 2 | 503 |
| WAFER A4 | 602 | 6 | 603 |
| WAFER A5 | 504 | 3 | 505 |
| WAFER A6 | 504 | 7 | 605 |
| --- | --- | --- | --- |

FIG. 8

| TRANSPORT STOP CRITERIA | INSPECTION ITEM | | | | | RELEVANT MODULE | RELEVANT UNIT BLOCK |
|---|---|---|---|---|---|---|---|
| | PATTERN COLLAPSE | POOR RESIST DISSOLUTION | BUBBLES AFTER DEVELOPMENT | ... | SCUM DEFECT | | |
| | 2/5 | 1/5 | 1/5 | ... | IMMEDIATE STOP | | |
| WAFER A1 | NONE | NONE | NONE | ... | NONE | | |
| WAFER A2 | NONE | NONE | NONE | ... | NONE | | |
| WAFER A3 | NONE | FOUND | NONE | ... | NONE | DEV1--- | B1, B3, B5 |
| WAFER A4 | NONE | NONE | NONE | ... | NONE | | |
| WAFER A5 | NONE | NONE | FOUND | ... | NONE | DEV5--- | B2, B4, B6 |
| WAFER A6 | NONE | NONE | NONE | ... | NONE | | |
| ... | --- | --- | --- | --- | --- | --- | --- |

|  |  |  |  |  |
|---|---|---|---|---|
| DEV5 | DEV6 | DEV7 | DEV8 | ~B6 |
| DEV1 | DEV2 | DEV3 | DEV4 | ~B5 |
| TCT3 | TCT4 |  |  | ~B4 |
| TCT1 | TCT2 |  |  | ~B3 |
| BCT3 | BCT4 | COT3 | COT4 | ~B2 |
| BCT1 | BCT2 | COT1 | COT2 | ~B1 |

|  |  |  |  |  |
|---|---|---|---|---|
| DEV5 | DEV6 | DEV7 | DEV8 | ~B6 |
| DEV1 | DEV2 | DEV3 | DEV4 | ~B5 |
| COT3 | COT4 | TCT3 | TCT4 | ~B4 |
| COT1 | COT2 | TCT1 | TCT2 | ~B3 |
| BCT3 | BCT4 |  |  | ~B2 |
| BCT1 | BCT2 |  |  | ~B1 |

| | | S2 | | |
|---|---|---|---|---|
| DEV5 | DEV6 | DEV7 | DEV8 | ~B6 |
| DEV1 | DEV2 | DEV3 | DEV4 | ~B5 |
| TCT3 | TCT4 | INSP 703 | INSP 704 | ~B4 |
| TCT1 | TCT2 | INSP 701 | INSP 702 | ~B3 |
| BCT3 | BCT4 | COT3 | COT4 | ~B2 |
| BCT1 | BCT2 | COT1 | COT2 | ~B1 |

FIG. 20

|       |       |       |       |      |
|-------|-------|-------|-------|------|
| DEV9  | DEV10 | DEV11 | DEV12 | ~B6  |
| DEV5  | DEV6  | DEV7  | DEV8  | ~B5  |
| DEV1  | DEV2  | DEV3  | DEV4  | ~B4  |
| BCT5  | BCT6  | COT5  | COT6  | ~B3  |
| BCT3  | BCT4  | COT3  | COT4  | ~B2  |
| BCT1  | BCT2  | COT1  | COT2  | ~B1  |

S2

FIG. 21

COATING AND DEVELOPING APPARATUS

CROSS REFERENCE TO RELATED APPLICATIONS

This application is a continuation of U.S. patent application Ser. No. 13/178,037, having a filing date of Jul. 7, 2011, and claims the benefit under 35 USC §119(a)-(d) of Japanese Patent Application No. 2010-156563 filed Jul. 9, 2010, and Japanese Patent Application No. 2011-053370 filed Mar. 10, 2011, the entireties of which are incorporated herein by reference.

FIELD OF THE INVENTION

The present disclosure relates to a coating and developing apparatus for applying a resist to a substrate and developing the resist after exposure.

BACKGROUND OF THE INVENTION

A semiconductor manufacturing process includes a photolithography process comprising applying a photoresist (hereinafter simply referred to as a resist) to a surface of a semiconductor wafer (hereinafter simply referred to as a wafer), exposing the resist in a predetermined pattern, and developing the exposed resist to form a resist pattern. A coating and developing apparatus for forming such a resist pattern includes a processing block having processing modules for performing various types of processing of a wafer.

The processing block is comprised of a stack of unit blocks for forming various types of coating films (e.g. resist film) and unit blocks for performing developing processing, as described e.g. in Japanese Patent Laid-Open Publication No. 2007-115831. A wafer undergoes processing in various processing modules, provided in the unit blocks, according to a predetermined sequence.

In order to meet recent demands for finer resist patterns, increased yield, etc., processing modules provided in a processing block are becoming diversified. For example, besides a resist film-forming module for applying a resist onto a substrate, such as a wafer and a developing module for supplying a developer to the substrate, a processing block may also be provide with a back surface cleaning module for cleaning the back surface of the substrate after resist coating and a liquid processing module that supplies a chemical solution onto the resist film to form an upper film over the resist film. With an increased number of diverse processing modules provided in a processing block of a coating and developing apparatus, there is a problem of how to reduce the increase in the footprint of the apparatus.

Stacking a plurality of unit blocks in a coating and developing apparatus, as described above, is effective for reducing the footprint of the apparatus. However, because a wafer is transported sequentially to the unit blocks, the operation of the entire coating and developing apparatus must be stopped when an abnormality occurs in one processing module or one unit block, or when performing maintenance of one processing module or one unit block. This significant lowers the operation efficiency of the apparatus.

SUMMARY OF THE INVENTION

The present disclosure provides a technique which can reduce the increase in the footprint of a processing block and which enables partial stop of a coating and developing apparatus upon the occurrence of an abnormality or upon maintenance, thereby reducing the lowing of the operation efficiency of the apparatus.

The present disclosure provides a coating and developing apparatus including a carrier block, a processing block, and an interface block connectable to an exposure apparatus, the coating and developing apparatus being configured to transfer a substrate, which has been carried by a carrier into the carrier block, to the processing block, form at least one coating film, including a resist film, on the substrate in the processing block, send the substrate to the exposure apparatus via the interface block, develop the substrate after exposure, which has returned via the interface block, in the processing block, and transfer the substrate to the carrier block, wherein: the processing block includes at least one coating film-forming unit block stack and a developing unit block stack which are vertically stacked on each other; each of the coating film-forming unit block stack is composed of a plurality of coating film-forming unit blocks vertically stacked on each other, and each coating film-forming unit block includes a plurality of processing modules; the plurality of processing modules include a coating film-forming module for supplying a chemical solution to the substrate so as to form a coating film on the substrate, and a heating module for heating the substrate; each coating film-forming unit block is provided therein with a transport mechanism that moves along a transport passage, extending linearly from a carrier block side to an interface block side, to transport the substrate between the processing modules belonging to the coating film-forming unit block; and the coating film-forming unit blocks of each coating film-forming unit block stack are configured to form the same one or more coating films; the developing unit block stack is composed of a plurality of developing unit blocks vertically stacked on each other, and each developing unit block includes a plurality of processing modules; the plurality of modules include a developing module for supplying a developer to the substrate, and a heating module for heating the substrate; and each developing unit block is provided therein with a transport mechanism that moves along a transport passage, extending linearly from the carrier block side to the interface block side, to transport the substrate between the processing modules belonging to the developing unit block; the coating and developing apparatus further includes:

first transfer units, each of which is, respectively, provided on the carrier block sides of the coating film-forming unit blocks and the developing unit blocks, for transferring the substrate to and from the transport mechanism of the associated coating film-forming unit or developing unit block; a first transfer mechanism configured to transfer the substrate, which has been removed from the carrier, to any one of the first transfer units associated with the coating film-forming unit blocks; and a control section configured to control transport of the substrate in the coating and developing apparatus.

In one embodiment, the processing block includes, as the at least one coating film-forming unit block stack, an early-stage process unit block stack and a later-stage process unit block stack which are vertically stacked on each other; the early-stage process unit block stack is composed of a plurality of early-stage process unit blocks vertically stacked on each other, each early-stage process unit block includes, as the coating film-forming module, an antireflection film-forming module for forming a lower antireflection film before formation of the resist film; the later-stage process unit block stack is composed of a plurality of later-stage process unit blocks vertically stacked on each other, each later-stage process unit block includes, as the coating film-forming module, an upper film-forming module for forming an upper film after formation of the resist film; and each of the early-stage process unit blocks, or each of the later-stage process unit blocks includes a resist film-forming module for forming the resist film on the substrate.

BRIEF DESCRIPTION OF THE DRAWINGS

FIG. 8 is a diagram showing data in a memory of the control section;

FIG. 17 is a side view illustrating the layout of the processing modules of another processing block usable in a coating and developing apparatus;

FIG. 19 is a side view illustrating the layout of the processing modules of yet another processing block usable in a coating and developing apparatus;

FIG. 20 is a side view illustrating the layout of the processing modules of yet another processing block usable in a coating and developing apparatus; and FIG. 21 is a side view illustrating the layout of the processing modules of yet another processing block usable in a coating and developing apparatus.

DETAILED DESCRIPTION OF THE INVENTION

Figure 1:
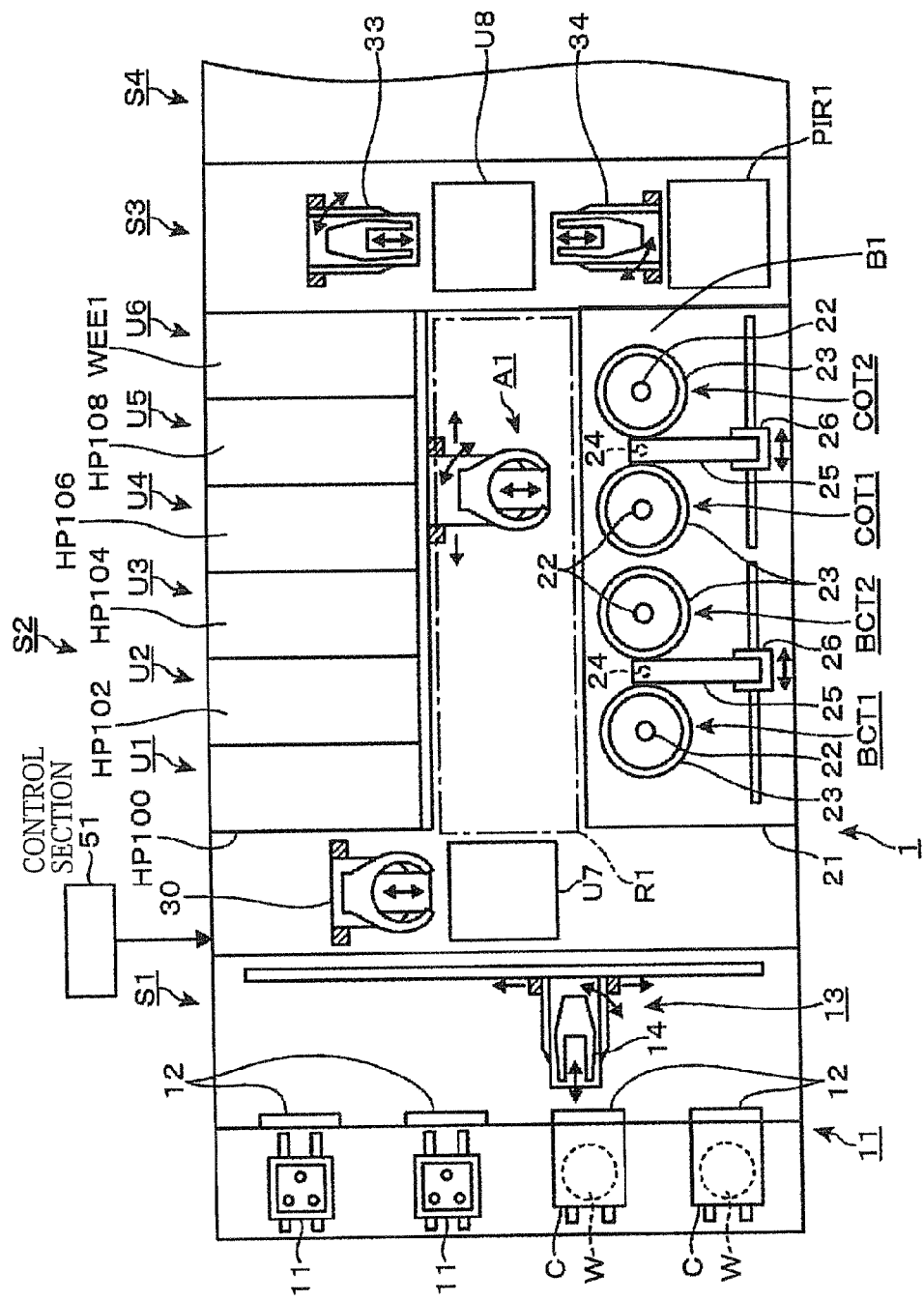
FIG. 1 is a plan view of a coating and developing apparatus in one embodiment.
Figure 2:
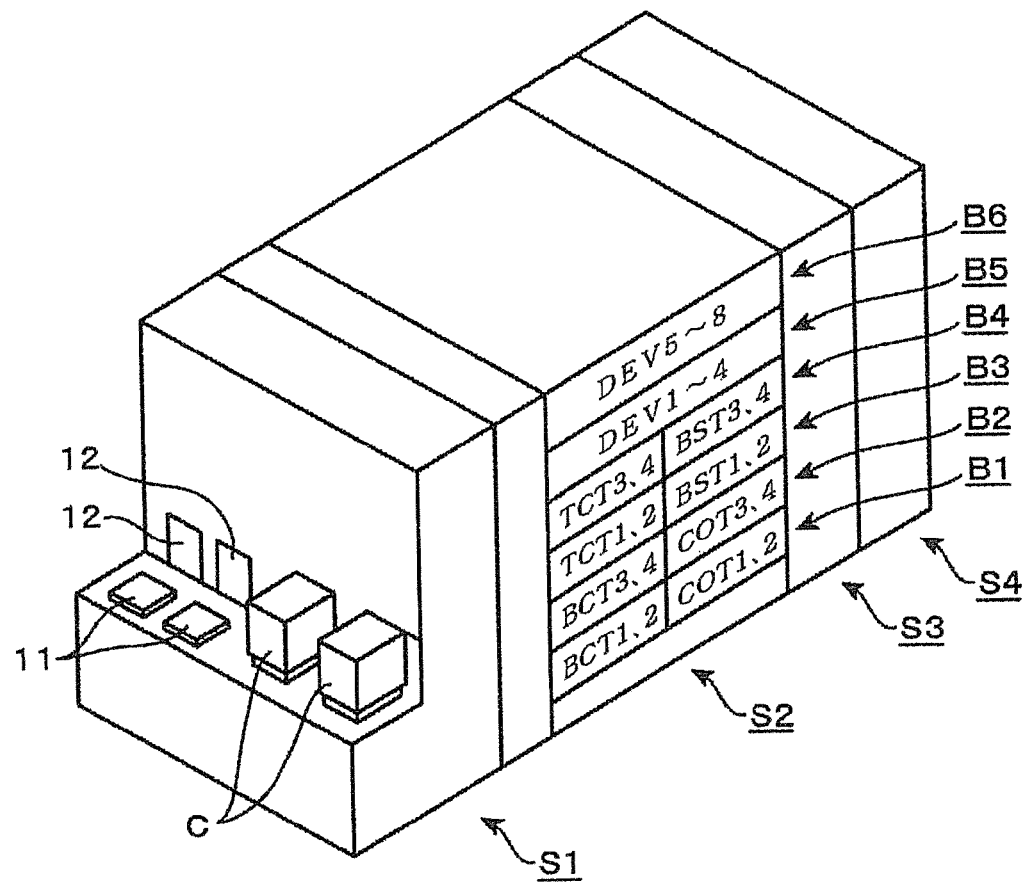
FIG. 2 is a perspective view of the coating and developing apparatus.

The construction of a coating and developing apparatus 1 will now be described with reference to FIGS. 1 to 3. The coating and developing apparatus 1 includes a carrier block 51 for receiving and delivering carriers C in each of which a plurality of, for example 25, wafers W are hermetically housed, a processing block S2 for performing processing of the wafers W, and an interface block S3, the blocks being arrayed linearly. To the interface block S3 is connected to an exposure apparatus S4 for performing immersion exposure. For the convenience of description of positional relationships in a plan view of the apparatus, the right side of FIG. 1 is hereinafter referred to as "anterior", the left side as "posterior", the upper side as "left", and the lower side as "right".

The carrier block S1 includes stages 11 for placing the carriers C thereon, shutters 12 provided in a wall in front of the stages 11, and a transfer arm 13 for taking wafers W out of the carriers C via the shutters 12. The transfer arm 13 has five wafer holders 14 arranged in the vertical direction, and is configured to be movable back and forth, vertically movable, rotatable on a vertical axis and movable in the carrier C arrangement direction. The below-described control section 51 assigns ID numbers to wafers W in each carrier C, and the transfer arm 13 transfers the wafers W to a transfer module BU1 (see FIG. 3) of the processing block S2 in a sequential manner such that 5 wafers are transferred at a time and that the wafers W are transferred in order of increasing ID number.

An element having a site on which a wafer W can be placed is herein referred to as "module". A module for carrying out processing of a wafer W, such as heating, processing with a liquid, supply of a gas, peripheral exposure, etc., is herein referred to as "processing module"; and a processing module for supplying a processing liquid, such as a chemical solution or a cleaning liquid, is herein referred to as "liquid processing module".

The processing block S2 is connected to the carrier block S1. The processing block S2 is composed of first to sixth unit blocks B1 to B6 which are stacked in this order and are each designed to perform particular liquid processing, as shown in FIG. 2. The processing block S2 will be further described below with reference also to FIG. 4 which is a schematic vertical sectional side view of the processing block S2.

The first unit block B1 and the second unit block B2, which are unit blocks for carrying out early-stage processing steps of a sequence of coating film-forming steps, have substantially the same construction and perform the formation of an antireflection film on a wafer W and the formation of a resist film on the wafer W. The third unit block B3 and the fourth unit block B4, which are unit blocks for carrying out later-stage processing steps of a sequence of coating film-forming steps, have substantially the same construction and perform the formation of a protective film for immersion exposure and perform cleaning of the back surface of the wafer W. The fifth unit block B5 and the sixth unit block B6, which are unit blocks for developing processing, have substantially the same construction and perform developing processing of the wafer W after immersion exposure. That is, the processing block S2 includes three pairs of unit blocks, each pair including two unit blocks which are stacked in two layers and have the same task (the same processing to wafers). The first to forth unit blocks B1 to B4 are herein sometimes referred to as coating film-forming unit blocks, and the fifth and sixth blocks B5 and B6 as developing unit blocks.

The unit blocks B1 to B6 each have liquid processing modules, heating modules, a main arm A which is a transport means for each unit block, and a transport region R1 in which the main arm A moves. The layout of the modules, the main arm and the transport region are substantially the same among the unit blocks. A wafer W is transported by the main arm A and is subjected to processing in each unit block independently of the other blocks. The transport region R1 is a linear transport passage extending from the carrier block S1 to the interface block S3. Only the first unit block B1 is shown in FIG. 1, and the following description illustrates the unit block B1 as a representative. The transport region R1 is formed in the center of the first unit block B1. A liquid processing unit 21 is disposed on the right of the transport region R1, and shelf units U1 to U6 are disposed on the left of the transport region R1.

The liquid processing unit 21 is provided therein with antireflection film-forming modules BCT1, BCT2, and resist film-forming modules COT1, COT2. The modules BCT1, BCT2, COT1 and COT2 are arranged in this order from the side of the carrier block S1 to the side of the interface block S3. The antireflection film-forming modules BCT1, BCT2 have one spin chuck 22 and the resist film-forming modules COT1, COT2 have one spin chuck 22. The spin chuck 22 is capable of attracting and holding a central portion of the back surface of a wafer W and is rotatable on a vertical axis. A top-open processing cup 23 surrounds the periphery of the spin chuck 22 to prevent scattering of a chemical solution. Upon processing of a wafer W, the wafer W is housed in the processing cup 23, with the central portion of the back surface of the wafer W being held by the spin chuck 22.

The antireflection film-forming modules BCT1, BCT2 are provided with a nozzle 24 which is shared by these modules. The nozzle 24 is supported by an arm 25. A drive mechanism 26, via the arm 25, moves the nozzle 24 in the arrangement direction of the processing cups 23 and vertically moves the nozzle 24. Thus, the nozzle 24 can be moved by means of the drive mechanism 26 between a position above the cup 23 of the antireflection film-forming module BCT1 and a position above the cup 23 of the antireflection film-forming module BCT2. The nozzle 24 can therefore eject an antireflection film-forming chemical solution toward the center of a wafer W held by each spin chuck 22. The chemical solution, which has been supplied from the nozzle 24 to the wafer W, spreads to the periphery of the wafer W due to centrifugal force caused by the rotation of the wafer W on a vertical axis, whereby an antireflection film is formed on the wafer W. Though not depicted, the antireflection film-forming modules BCT1, BCT2 are provided with a nozzle for supplying a solvent to a peripheral portion of a wafer W to remove an unnecessary film in the peripheral portion.

The resist film-forming modules COT1, COT2 have substantially the same mechanical construction as the antireflection film-forming modules BCT1, BCT2. Thus, the resist film-forming modules COT1, COT2 each have a processing cup 23 for processing of a wafer W and have a spin chuck 22, and the two processing cups 23 and the two spin chucks 22 share one nozzle 24. Instead of the antireflection film-forming chemical solution, a resist is supplied from the nozzle 24. Though the liquid processing modules have been described such that "one liquid processing module has one processing cup 23 (spin chuck 22) and two processing modules share one nozzle 24", it is also possible to regard the liquid processing modules as having the construction that "one liquid processing module has one nozzle 24 and two processing cups 23 (spin chucks 22)".

The shelf units U1 to U6 are arranged in this order from the side of the carrier block S1 to the side of the interface block S3. The shelf units U1 to U5 are each comprised of heating modules, stacked e.g. in two stages, for performing heating of a wafer W. Each heating module includes a hot plate for heating a wafer W and a cooling plate for cooling the wafer W after the heating. The unit block B1 thus has 10 heating modules HP100 to HP109. The shelf unit U6 is comprised of a stack of peripheral exposure modules WEE1, WEE2 for performing peripheral exposure of a wafer W after resist coating.

The main arm A1 is provided in the transport region R1. The main arm A1 is configured to be movable back and forth, vertically movable, rotatable on a vertical axis and movable in the longitudinal direction of the processing block S2, so that a wafer W can be transferred between all the modules of the unit block B1.

The other unit blocks will now be described. The second unit block B2 has the same construction as the above-described first unit block B1 and is provided with antireflection film-forming modules BCT3, BCT4 and resist film-forming modules COT3, COT4, as shown in FIG. 2. The shelf units U1 to U5 are comprised of 10 heating modules HP200 to HP209. The shelf unit U6 is comprised of two peripheral exposure modules WEE3, WEE4.

The construction of the third unit block B3 is similar to the construction of the first unit block B1, but differs in that immersion exposure protective film-forming modules TCT1, TCT2 are provided instead of the antireflection film-forming modules BCT1, BCT2 and that back surface cleaning modules BST1, BST2 are provided instead of the resist film-forming modules COT1, COT2. The protective film-forming modules TCT1, TCT2 have the same mechanical construction as the antireflection film-forming modules BCT1, BCT2 except that a chemical solution for the formation of a water-repellent protective film is supplied to a wafer W. The protective film-forming modules TCT1, TCT2 each have a processing cup 23 for processing of a wafer W and have a spin chuck 22, and a nozzle 24 is shared by the two processing cups 23 and the two spin chucks 22.

The back surface cleaning modules BST1, BST2 are not provided with a nozzle 24 for supplying a chemical solution to the front surface of a wafer W, but instead are each provided with a nozzle for supplying a cleaning liquid to the back surface and a peripheral bevel portion of a wafer W to clean the back surface of the wafer W. Except for this difference, the back surface cleaning modules BST1, BST2 have the same mechanical construction as the antireflection film-forming modules BCT1, BCT2. The back surface cleaning modules BST1, BST2 may be configured to clean only the back surface of a wafer W or only the bevel portion. Further, the back surface cleaning modules BST1, BST2 may be configured to scrub clean the back surface of a wafer W by using a brush member in addition to a cleaning liquid. The shelf unit U6 of the third unit block B3 is comprised of heating modules instead of the peripheral exposure modules WEE. Thus, the shelf units U1 to U6 of the third unit block B3 are comprised of heating modules 300 to 311.

The fourth unit block B4 has the same construction as the above-described third unit block B3 and is provided with protective film-forming modules TCT3, TCT4 and back surface cleaning modules BST3, BST4. The shelf units U1 to U6 of the fourth unit block B4 are comprised of heating modules HP400 to HP411.

The construction of the fifth unit block B5 is similar to the construction of the first unit block B1, but differs in that developing modules DEV1 to DEV4 are provided instead of the antireflection film-forming modules BCT1, BCT2 and the resist film-forming modules COT1, COT2. Each developing module (DEV1 to DEV4) has the same mechanical construction as each resist film-forming module (COT1, COT2) except that instead of the resist, a developer is supplied to a wafer W. The shelf units U1 to U6 of the fifth unit block B5 are comprised of heating modules HP500 to HP511.

The sixth unit block B6 has the same construction as the unit block B5 and is provided with developing modules DEV5 to DEV8. The shelf units U1 to U6 of the sixth unit block B6 are comprised of heating modules HP600 to HP611. Note that the reference signs designating the antireflection film-forming modules (BCT1 to BCT4), the resist film-forming modules (COT1 to COT4), the protective film-forming modules (TCT1 to TCT4), the back surface cleaning modules (BST1 to BST4) and the developing modules (DEV1 to DEV8) are sometimes simplified by removing the numeral part thereof (e.g., COT1→COT) in a case where there is no need to distinguish individual modules from each other.

In the liquid processing unit 21 of each unit block, a chemical solution which has been supplied to a wafer W is discharged toward a not-shown drainage path provided e.g. below the coating and developing apparatus. The chemical solutions supplied to wafers W in the antireflection film-forming modules BCT, the resist film-forming modules COT and the protective film-forming modules TCT have a higher viscosity than a developer. Accordingly, all the chemical solutions can be rapidly discharged by disposing the developing modules DEV in the upper unit blocks and disposing the other liquid processing modules in the lower unit blocks as in this embodiment. This can prevent vaporization of the chemical solutions in the processing modules, thereby preventing a change in the processing environment in each liquid processing unit 21.

Figure 3:
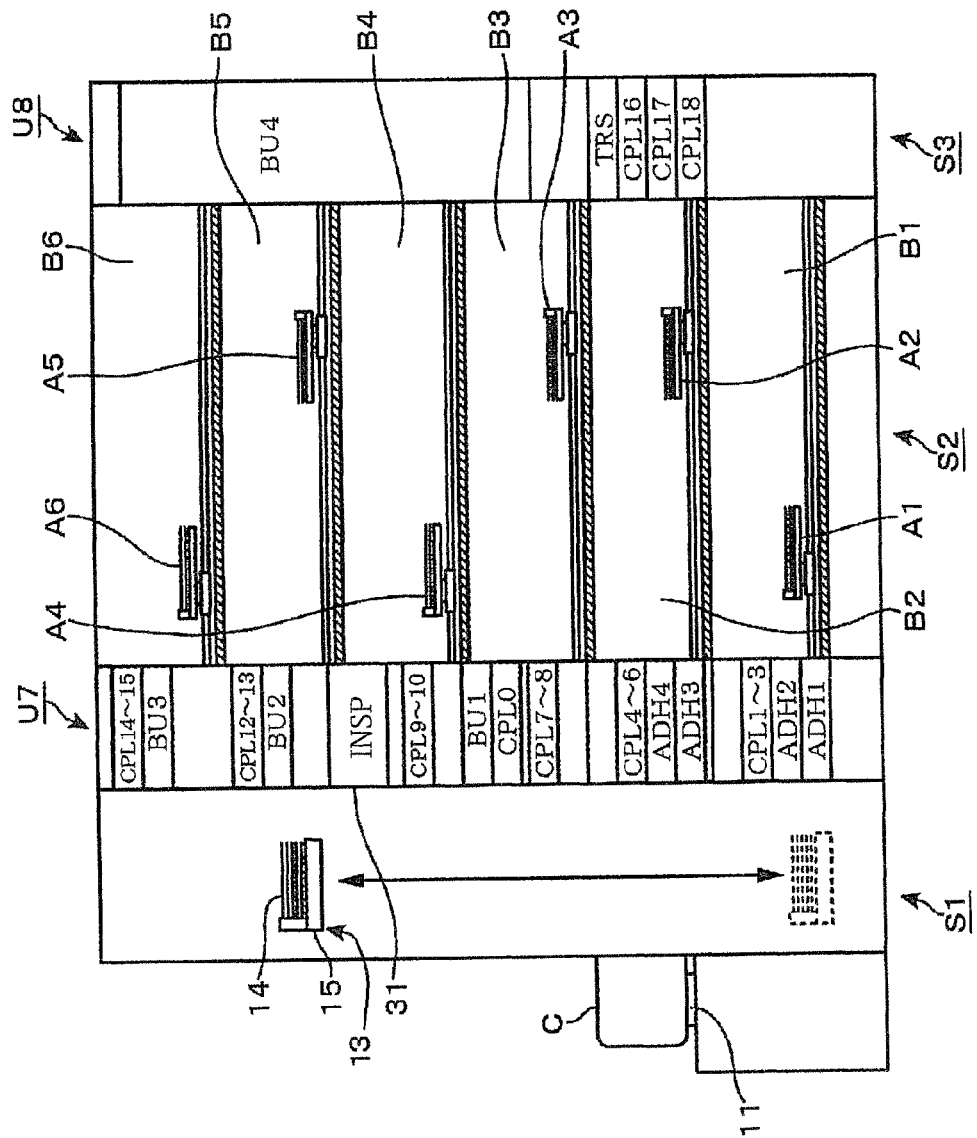
FIG. 3 is a vertical sectional side view of the coating and developing apparatus.

As shown in FIGS. 1 and 3, a shelf unit U7, vertically extending across the unit blocks B1 to B6, is provided on the carrier block S1 side of the transport region R1. The construction of the shelf unit U7 will now be described. The shelf unit U7 is comprised of a stack of a plurality of modules. Hydrophobizing modules ADH1, ADH2 and transfer modules CPL1 to CPL3 are provided in height positions accessible by the main arm A1 of the first unit block B1. Hydrophobizing modules ADH3, ADH4 and transfer modules CPL4 to CPL6 are provided in height positions accessible by the main arm A2 of the second unit block B2. A transfer module with the symbol "CPL" is provided with a cooling stage for cooling a wafer W placed on it. A transfer module with the symbol "BU" is configured to be capable of housing and retaining a plurality of wafers W.

The hydrophobizing modules ADH1 to ADH4 supply a processing gas to a wafer W to enhance the hydrophobicity of the surface of the wafer W, thereby preventing a film from peeling off the wafer W upon immersion exposure. Especially by enhancing the hydrophobicity of the bevel portion (peripheral end portion) of the wafer W, even when a film(s) is removed from the bevel portion in a liquid processing module(s) and the surface of the bevel portion becomes exposed, the exposed surface has water repellency. This can prevent the remaining film(s) from peeling at the end portion, lying adjacent to the exposed bevel portion, upon immersion exposure.

Transfer modules CPL7, CPL8 and transfer modules CPL9, CPL10 are provided in height positions accessible by the main arms A3, A4 of the unit blocks B3, B4. Further, transfer modules BU1 and CPL0 are provided in height positions accessible by the transfer arm 13 of the carrier block S1. The transfer module BU1 has vertically-arranged 5 wafer holders to receive wafers W at a time from the transfer arm 13. The transfer module CPL0 is employed to return a wafer W after development to the carrier C.

Transfer modules CPL12, CPL13 and BU2 are provided in height positions accessible by the main arm A5 of the unit block B5. Transfer modules CPL14, CPL15 and BU3 are provided in height positions accessible by the main arm A6 of the unit block B6.

The shelf unit U7 is provided with an inspection module 31. When carrying wafers W out of the unit blocks B5, B6, those which are scheduled to be carried into the inspection module (INSP) 31, are carried into the transfer modules BU2, BU3. On the other hand, those wafers W which are not to be carried into the inspection module 31 are returned to the carrier C without carrying them into the transfer modules BU2, BU3. By thus setting a transport route for each wafer, transport of wafers W is controlled such that the wafers W return to the carrier C in order of ID number, i.e. in order of transport from the carrier C.

In the processing block B2, a transfer arm 30 as a first transfer mechanism, configured to be vertically movable and movable back and forth, is provided in the vicinity of the shelf unit U7. The transfer arm 30 transports a wafer W between the modules of the shelf unit U7.

The inspection module 31 will now be described in greater detail. According to a selected inspection mode as will be described later, a wafer W after the formation of a resist film and before exposure or a wafer W after development is carried into the inspection module 31. The wafer W after the formation of a resist film and before exposure is inspected e.g. for the presence or absence of foreign matter on the resist film and the thickness of the resist film.

The wafer W after development is inspected for development-related defects. The development-related defects are classified into defects due to development and defects due to development and coating. Examples of the defects due to development may include pattern collapse, abnormal line width, poor resist dissolution, adhesion of bubbles after development, adhesion of foreign matter, bridging in a resist pattern (residual resist bridging adjacent raised portions), and pattern defect (scum defect) due to a residual dissolved product (scum). Examples of the defects due to development and coating may include pattern collapse and abnormal line width.

In this embodiment the presence or absence of each such defect is set as an inspection item. Upon implementation of a selected inspection mode as described below, the inspection module 31 sends inspection data to the below-described control section 51. Based on the inspection data, the control section 51 determines the presence or absence of each defect.

Figure 5:
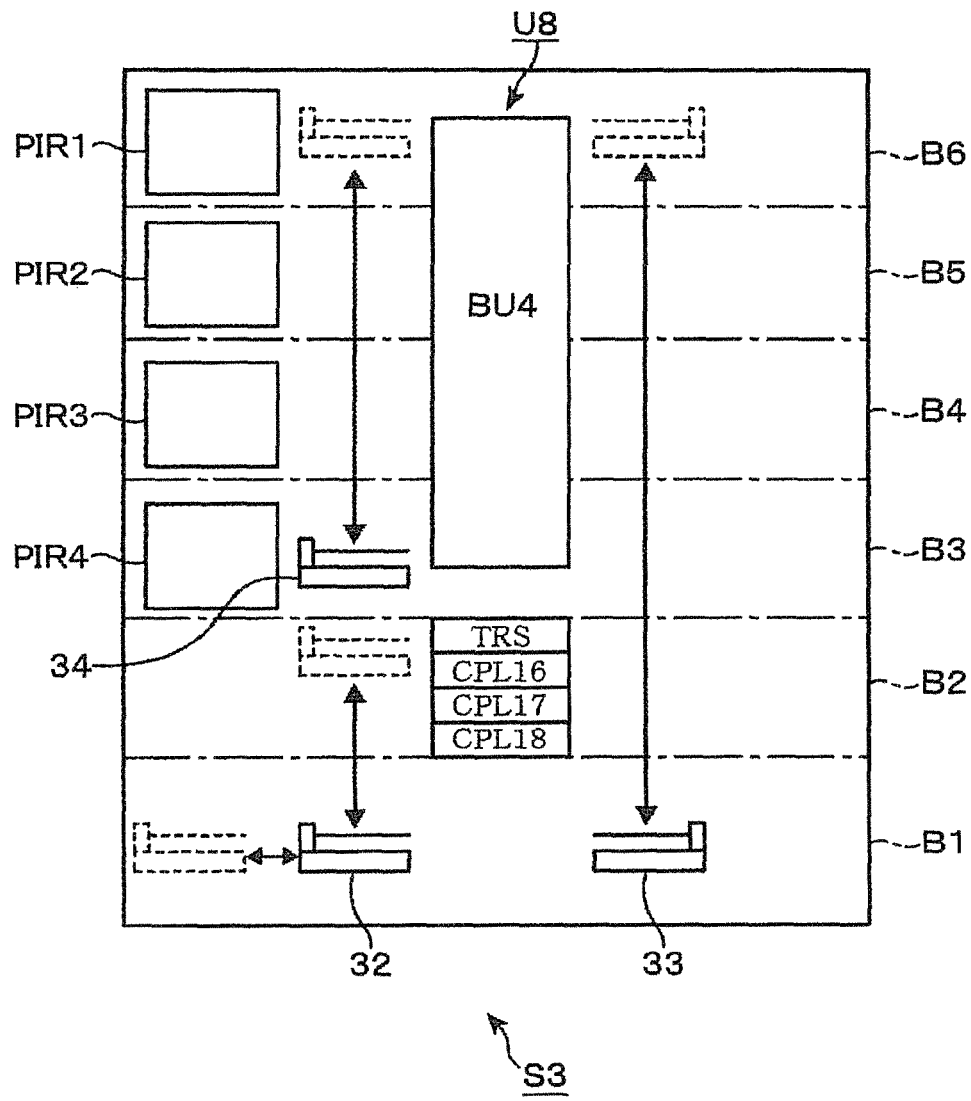
FIG. 5 is a vertical sectional front view of an interface block.

The construction of the interface block S3 will now be described with reference also to FIG. 5. The interface block S3 is provided with a shelf unit U8 in a position accessible by the main arms A1 to A6 of the unit blocks. The shelf unit U8 has a transfer module BU4 in a position corresponding to the third unit block B3 to the sixth unit block B6. The transfer module BU4 will be described in detail later. A stack of transfer modules TRS, CPL16 to CPL18 is provided under the transfer module BU4.

The interface block S3 is provided with a stack of a plurality of, for example four, post-exposure cleaning modules PIR1 to PIR4. Each post-exposure cleaning module PIR has the same mechanical construction as each resist film-forming module COT, but supplies, instead of the resist, a chemical solution for removal of a protective film and for cleaning to the surface of a wafer W.

The interface block S3 is also provided with three interface arms 32, 33, 34. The interface arms 32, 33, 34 are configured to be vertically movable and movable back and forth, and the interface arm 32 is also configured to be movable in a horizontal direction. The interface arm 32 approaches the exposure apparatus S4 and the transfer modules TRS, CPL16 to CPL18 to transfer a wafer W between them. The interface arm 33 approaches the transfer modules TRS, CPL16 to CPL18 and BU4 to transfer a wafer W between these modules. The interface arm 34 approaches the transfer module BU4 and the post-exposure cleaning modules PIR1 to PIR4 to transfer a wafer W between these modules. The interface arms 32 to 34 constitute a second transfer mechanism.

Figure 6:
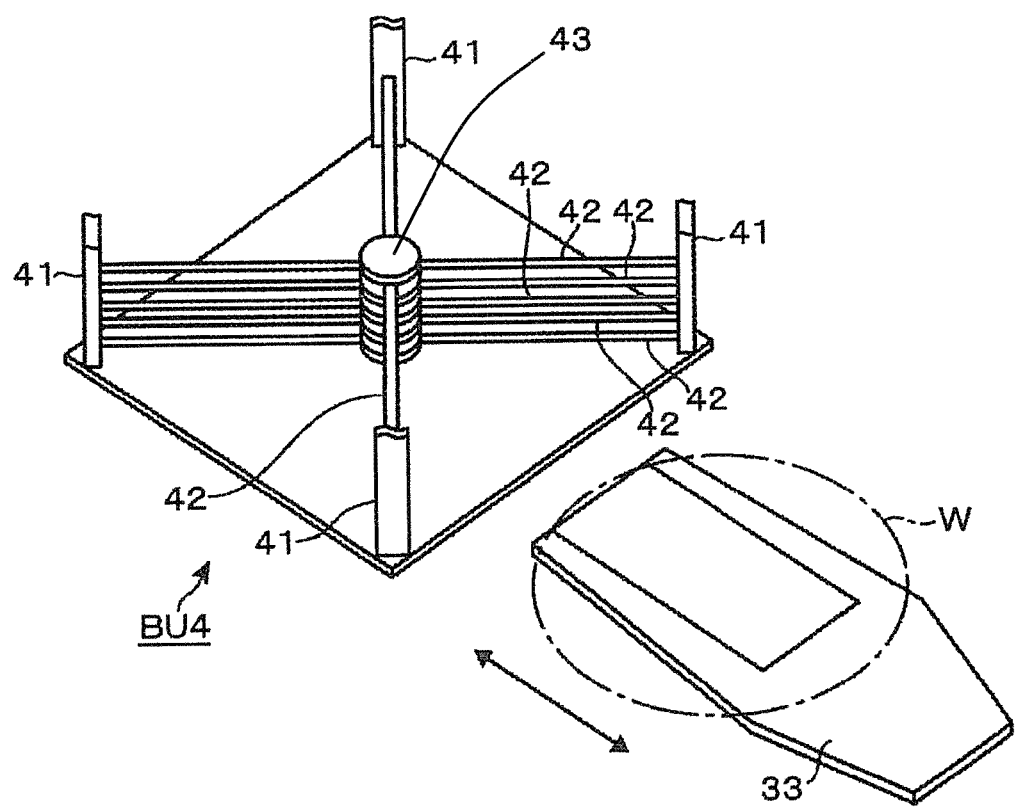
FIG. 6 is a perspective view of a transfer module provided in the interface block.

The transfer module BU4 will now be described with reference to FIG. 6. The transfer module BU4 includes circumferentially-arranged support posts 41. Wires 42 are stretched between opposing support posts 41, and two wires 42, 42 intersecting with each other make a pair. A number of such pairs are provided at different height positions, and circular support portions 43 are provided on the intersections of the wires 42, 42. Wafers W are supported in a horizontal position on the support portions 43. Though only five support portions 43 are shown in FIG. 6, a larger number of support portions are actually provided. The interface arms 33, 34 and the main arms A3 to A6 can pass between the support posts 41 and enter the transfer module BU4. Each arm that has entered the module BU4 moves vertically and transfers a wafer W between the arm and a support portion 43. The transfer modules BU1 to BU3 have the same construction as the transfer module BU4.

Figure 7:
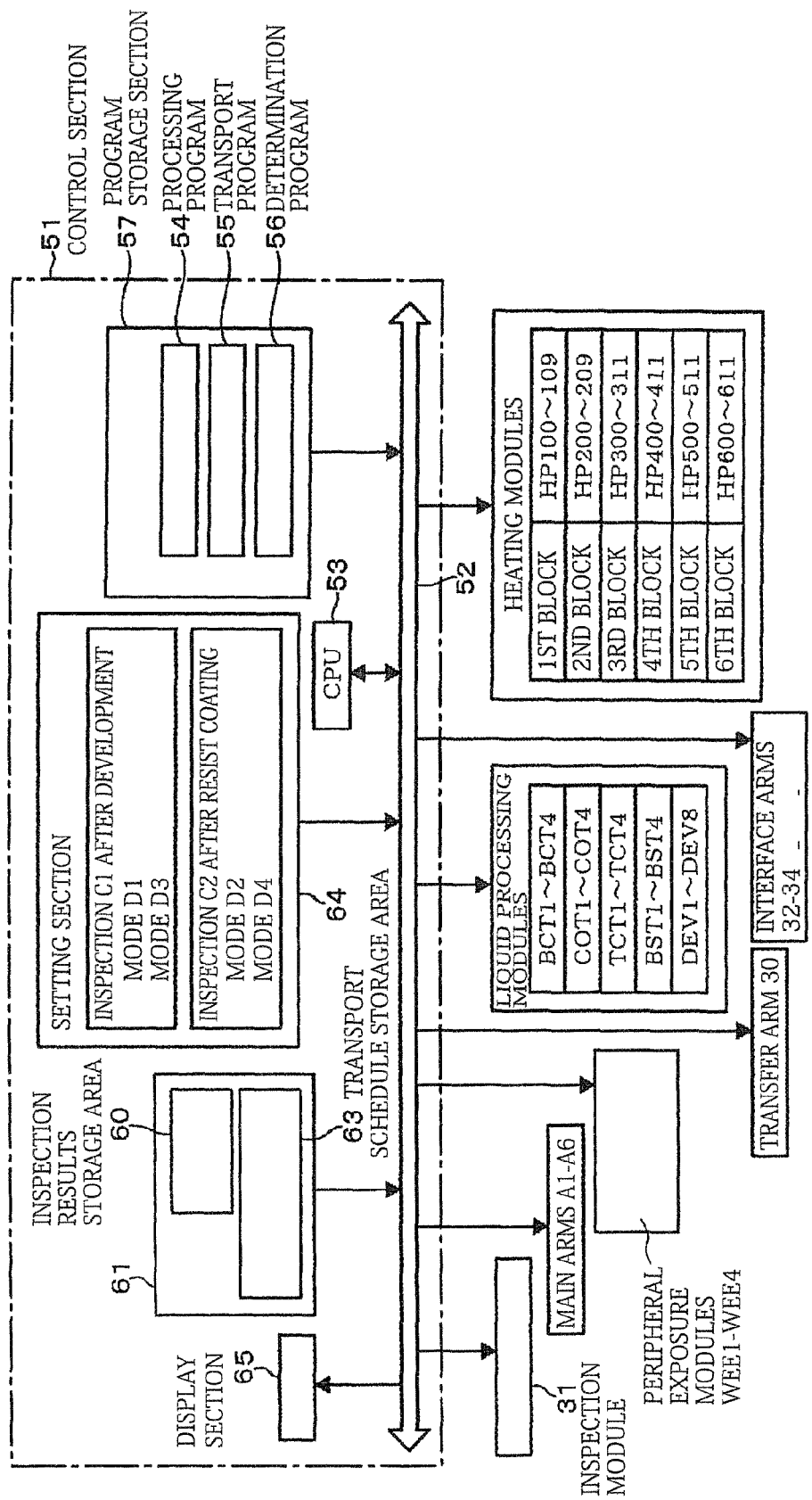
FIG. 7 is a diagram showing the construction of the control section of the coating and developing apparatus.

The control section 51 provided in the coating and developing apparatus 1 will now be described with reference to FIG. 7. A CPU53 which performs various operations is connected to a bus 52. To the bus 52 is also connected a program storage section 57 in which a processing program 54, a transport program 55 and a determination program 56 are stored. The processing program 54 causes the control section 51 to output control signals to various components of the coating and developing apparatus 1 to carry out processing of each wafer W, such as supply of a chemical solution or a cleaning liquid, heating, etc.

The transport program 55, according to a selected inspection mode and the results of determination of the determination program 56, causes the control section 51 to output control signals to the main arms A1 to A6 of the unit blocks B1 to B6, the transfer arm 30 and the interface arms 32 to 34 so as to control transport of each wafer W. The determination program 56, e.g. based on inspection data sent from the inspection module 31, determines the presence or absence of an abnormality in a processed wafer W.

A memory 61 is connected to the bus 52. A transport schedule and the results of inspection by the inspection module 31 for each wafer W are stored in the memory 61. FIG. 8 shows exemplary data to be stored in a transport schedule storage area 63 in the memory 61. The data represents a normal transport schedule as used when the inspection of the inspection module 31 find no abnormality in wafers W.

The ID of a wafer W, the modules to which the wafer W is to be transported and the order of transport to the modules are, in their relation, stored as a transport schedule in the transport schedule storage area 63. Thus, the transport schedule represents data on the transport route of each wafer. For example, the wafer with ID "A1", shown in FIG. 8, is transported to the antireflection film-forming module BCT1, the heating module HP100, the resist film-forming module COT1, the heating module HP101, the peripheral exposure module WEE1, the protective film-forming module TCT1, the heating module HP300, the back surface cleaning module BST1, the heating module 500, the developing module DEV1, and the heating module 501 in this order.

The transport schedule of this example is set such that wafers W are transported either in the order of: the first unit block B1→the third unit block B3→4 the fifth unit block B5, or in the order of: the second unit block B2→the fourth unit block B4→the sixth unit block B6. When a wafer W is transported to the first unit block B1, the next wafer W is transported to the second unit block B2, and the next wafer W is transported to the first unit block B1. Wafers W, which are successively carried out of a carrier C, are thus alternately directed to the different unit blocks.

An inspection results storage area 60 in the memory 61 will now be described with reference to FIG. 9. The inspection results storage area 60 is an area where data on the presence or absence of an abnormality in each wafer is stored for each of the above-described inspection items. For a wafer W with an abnormality, a module and a unit block which have processed the wafer W are stored in the storage area 60, as will be described later.

Transport stop criteria, set for respective inspection items, are also stored in the inspection results storage area 60. When an abnormality is detected in a wafer W, the relevant transport stop criterion is used to determine whether to stop transport of subsequent wafers W to a unit block B or a processing module which has processed the defective wafer W. The stop of wafer transport is implemented when the frequency of the occurrence of abnormality meets the transport stop criterion.

The transport stop criteria will now be described taking the criterion set for pattern collapse, shown in FIG. 9, as an example. In the case where the below-described mode to stop wafer transport to an individual unit block is selected, if pattern collapse is first detected in an inspected wafer W and pattern collapse is later detected in at least two of five later inspected wafers W which have passed through the same unit block as the first defective wafer W has passed through, then transport of subsequent wafers W to the unit block is stopped.

In the case where the below-described mode to stop wafer transport to an individual processing module is selected, if pattern collapse is first detected in an inspected wafer W and pattern collapse is later detected in at least two of five later inspected wafers W which have passed through the same processing module as the first defective wafer W has passed through, then transport of subsequent wafers W to the processing module is stopped. If pattern collapse is detected in zero or one of the five inspected wafers W, a later inspected wafer W in which pattern collapse is first detected after the inspection of the five preceding wafers W is newly taken as a first defective wafer W. Thus, if pattern collapse is later detected in at least two of five later inspected wafers W which have passed through the same unit block or the same processing module as the first defective wafer W has passed through, then transport of subsequent wafers W to the unit block or the processing module is stopped.

Figure 9:
FIG. 9 is a diagram showing data in a memory of the control section.

As shown in FIG. 9, transport stop criteria, which are similar to the transport stop criterion for pattern collapse, are set for poor resist dissolution and for bubbles after development. However, the transport stop criteria differ from the criterion for pattern collapse in that wafer transport to a relevant unit block B or processing module is stopped if a defect is first detected in an inspected wafer W and the same defect is later detected in at least one of five later inspected wafers W. In the case of the transport stop criterion for scum defect, shown in FIG. 9, wafer transport to a relevant unit block or processing module is stopped immediately after first detection of the defect in a wafer W. Such a transport stop criterion is set for each of the above-described inspection items. This prevents stop of wafer transport to a unit block or a processing module upon the accidental occurrence of a defect in a wafer W.

Returning to FIG. 7, a setting section 64 is connected to the bus 52. The setting section 64 is, for example, comprised of a keyboard and a mouse, a touch panel, or the like, and can set inspections to be performed in the inspection module 31. Inspections which can be set include inspection C1 after development and inspection C2 after resist film formation; a user selects one of them. In the inspection C1 after development, a wafer W which has undergone developing processing in the fifth unit block B5 or the sixth unit block B6 is transported to the inspection module 31 and inspected. In the inspection C2 after resist film formation, a wafer W which has undergone resist film-forming processing in the first unit block B1 or the second unit block B2 is transported to the inspection module 31 and inspected.

When the inspection C1 after development is selected, the user further selects one of a mode D1 to stop wafer transport to an individual unit block B (i.e. to all the modules of the unit block) and a mode D3 to stop wafer transport to an individual processing module. When the inspection C2 after resist film formation is selected, the user further selects one of a mode D2 to stop wafer transport to an individual unit block B and a mode D4 to stop wafer transport to an individual processing module.

Further, the user can specify a wafer W to be inspected e.g. by specifying the ID of the wafer W via the setting section 64. To the bus 52 is also connected a display section 65 e.g. comprised of a liquid crystal display. A transport schedule, the results of inspection of each wafer for each inspection item, etc. are displayed on the display section 65.

Mode D1

Wafer transport routes in the coating and developing apparatus 1 will now be described with reference to FIGS. 10(a) and 10(b). The transport routes shown in the figures are employed in the case where the inspection C1 after development is selected and the mode D1 to stop wafer transport to an individual unit block is also selected. First, a wafer W is transported by the transfer arm 14 from a carrier C to the transfer module BU1. In the case where the wafer W is transported from the transfer module BU1 to the first unit block B1, the wafer W is transported by the transfer arm 30 to the hydrophobizing module ADH1 or ADH2, where the wafer W undergoes hydrophobizing processing, and the wafer W is then transported to the transfer module CPL1, as shown in FIG. 10(a).

The wafer W which has been transported to the transfer module CPL1 is transported by the main arm A1 in the following order: the antireflection film-forming module BCT1 or BCT2→one of the heating modules HP100 to HP109→the transfer module CPL2→the resist film-forming module COT1 or COT2→one of the heating modules HP100 to HP109→the peripheral exposure module WEE3 or WEE4→the transfer module CPL3. An antireflection film and a resist film are thus sequentially formed on the wafer W.

The wafer W is transported by the transfer arm 30 from the transfer module CPL3 to the transfer module CPL7 of the third unit block B3. Thereafter, the main arm A3 transports the wafer W in the following order: the protective film-forming module TCT1 or TCT2→one of the heating modules HP300 to HP311→the transfer module CPL8→the back surface cleaning module BST1 or BST2→the transfer module BU4. Thus, a protective film is formed on the wafer W, and the back surface of the wafer W is cleaned.

Thereafter, the wafer W is transported by the interface arm 33 in the order of: one of the transfer modules CPL16 to CPL18→the interface arm 32→the exposure apparatus (EXP) S4. Thus, the wafer W undergoes immersion exposure processing. After the exposure processing, the wafer W is transported in the flowing order: the interface arm 32→the transfer module TRS→the interface arm 33→the transfer module BU4→the interface arm 34→one of the post-exposure cleaning modules PIR1 to PIR4→the interface arm 34→a support portion 43 in the transfer module BU4, lying in a height position corresponding to the fifth unit block B5.

Subsequently, the wafer W is transported by the main arm A5 in the following order: one of the heating modules HP500 to HP511→the transfer module CPL12→one of the developing modules DEV1 to DEV4→one of the heating modules HP500 to HP511→the transfer module CPL13→the transfer arm 30→the transfer module BU2→the inspection module 31. Thus, the wafer W is inspected after development. The wafer W after inspection is transported in the order of: the inspection module 31→the transfer arm 30→the transfer module BU1, and is returned by the transfer arm 13 to the carrier C. A wafer W which is not set to be inspected in the inspection module 31, after undergoing processing in one of the developing modules DEV1 to DEV4 and then in one of the heating modules HP500 to HP511, is transported in the following order: the transfer module CPL13→the transfer arm 30→the transfer module CPL0→the transfer arm 13→the carrier C.

Also in the case where a wafer W is transported from the transfer module BU1 to the unit blocks B2, B4, B6, the wafer W is subjected to the same processing as in the above-described case where a wafer is transported to the unit blocks B1, B3, B5. FIG. 10(b) shows a transport route in the case where a wafer W passes through the unit block B2, the unit block B4 and the unit block B6 in this order.

The transport route will now be briefly described. The wafer W is first transported in the order of the transfer arm 30→the hydrophobizing module ADH3 or ADH4→the transfer arm 30→the transfer module CPL4. Subsequently, the wafer W is transported by the main arm A2 in the following order: the antireflection film-forming module BCT3 or BCT4→one of the heating modules HP200 to HP209→the transfer module CPL5→the resist film-forming module COT3 or COT4→one of the heating modules HP200 to HP209→the peripheral exposure module WEE3 or WEE4→the transfer module CPL6. Thereafter, the substrate W is transported in the order of the transfer arm 30→the transfer module CPL9. Thereafter, the wafer W is transported by the main arm A4 in the following order: the protective film-forming module TCT3 or TCT4→one of the heating modules HP400 to HP411→the transfer module CPL10→the back surface cleaning module BST3 or BST4→the transfer module BU4.

In the interface block S3, the wafer W is transported in the same manner as the above-described wafer W after its transport to the third unit block B3 and undergoes exposure processing and post-exposure cleaning, and is then transferred to a support portion 43 in the transfer module BU4, lying in a height position corresponding to the sixth unit block B6. Thereafter, the wafer W is transported by the main arm A6 in the following order: one of the heating modules HP600 to HP611→the transfer module CPL14→one of the developing modules DEV5 to DEV8→one of the heating modules HP600 to HP611→the transfer module CPL15→the transfer module BU3→the transfer arm 30→the inspection module 31→the transfer arm 30→the transfer module CPL0→the carrier C. A wafer W which is not an inspection object, after developed and heated while transported along the foregoing transport route, is transported in the following order: the transfer module CPL15→the transfer arm 30→the transfer module CPL0→the transfer arm 13→the carrier C.

Figure 11:
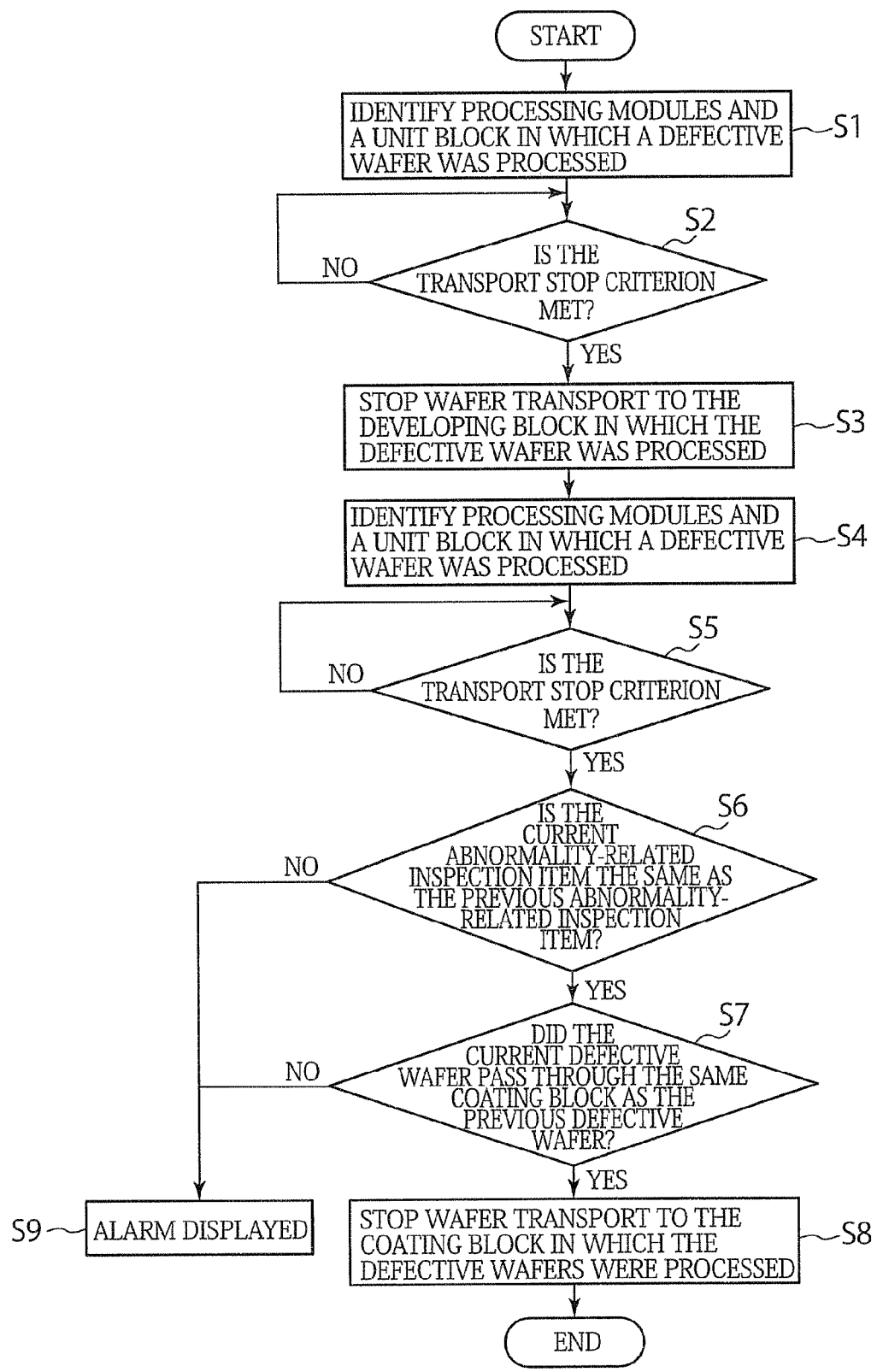
FIG. 11 is a flow chart illustrating the process of stopping transport of wafers to a unit block.

A process of stopping wafer transport to a unit block B by means of the control section 51 will now be described with reference to FIG. 11. While wafers W are transported along the above-described route, the determination program 56 determines the presence or absence of an abnormality for each of the above-described inspection items based on inspection data sent from the inspection module 31, and the results of determination are stored in the inspection results storage area 60 in the memory 61. Upon determination of an abnormality, the determination program 56, based on the transport schedule in the transport schedule storage area 63 in the memory 61, identifies processing modules and a unit block B that have processed the defective wafer W. Further, the ID of the wafer W, the abnormality-related inspection item, and the identified processing modules and unit block B are, in their relation, stored in the inspection results storage area 60 in the memory 61 (step S1).

Subsequently, the determination program 56, based on the past inspection history of wafers W stored in the inspection results storage area 60, determines if the transport stop criterion set for the inspection item is met (step S2). For example, as described above, in the case where the abnormality-related inspection item is pattern collapse, a determination is made, with reference to wafers W that have passed through the same block B, as to whether pattern collapse has occurred in at least two of five later inspected wafers W after the first occurrence of pattern collapse in a wafer W. If it is determined that the transport stop criterion is not met, processing of wafers W in the unit blocks B1 to B6 is continued.

If it is determined that the transport stop criterion is met, processing of wafers W is stopped in the processing modules of the unit block B5 or B6 which has carried out processing of the wafer W in which the abnormality has been detected in the step S1, and the operation of the main arm A is also stopped. The transport program 55 rewrites the transport schedule so that processing of wafers will be carried out by using the unit block B5 or B6 in which the operations of the processing modules and the main arm A are not stopped. Wafers W are then transported and processed according to the revised transport schedule (step S3).

Figure 12:
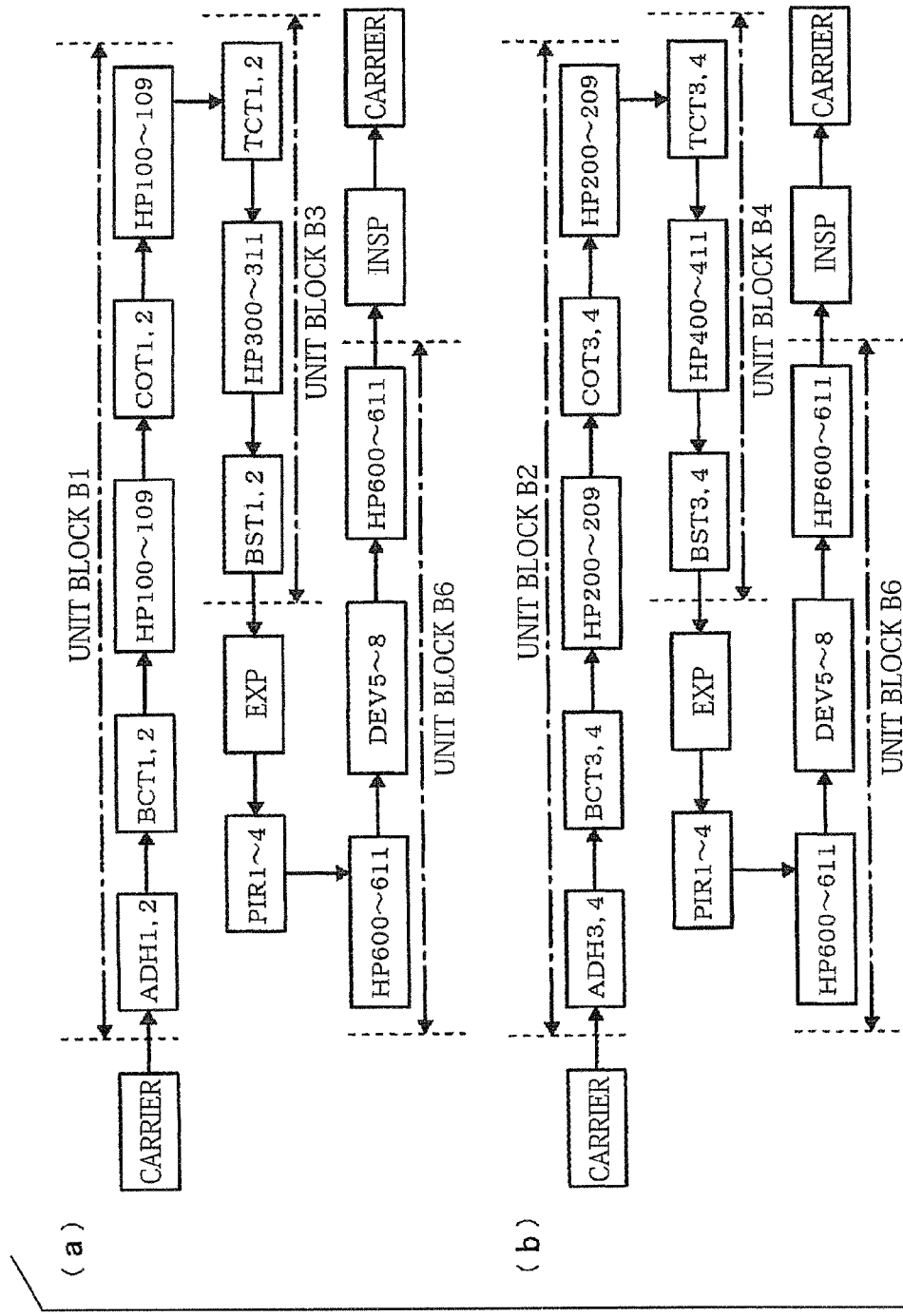
FIGS. 12(a) and 12(b) are diagrams illustrating wafer transport routes upon detection of an abnormality.

FIGS. 12(*a*), 12(*b*) each show a transport route in the case where transport of wafers W to the fifth unit block B5 is stopped according to the above. As shown in the figures, all the wafers W that have undergone processing in the first to fourth unit blocks B1 to B4 are carried into the sixth unit block B6. On the contrary, in the case where wafer transport to the sixth unit block B6 is stopped, all the wafers W that have undergone processing in the first to fourth unit blocks B1 to B4 are carried into the fifth unit block B5.

Processing of wafers is thus continued by using only one of the developing blocks. When an abnormality is later detected in a wafer W, the procedure of the step S1 is followed. Thus, the determination program 56, based on the transport schedule in the transport schedule storage area 63 in the memory 61, identifies processing modules and a unit block B that have processed the defective wafer W. Further, the ID of the wafer W, the abnormality-related inspection item, and the identified processing modules and unit block B are, in their relation, stored in the memory 61 (step S4).

Subsequently, the determination program 56, based on the inspection history of wafers W after the stop of wafer transport to the unit block B5 or B6, determines if the transport stop criterion set for the relevant inspection item is met (step S5). If it is determined that the transport stop criterion is not met, processing of wafers W in the unit blocks B1 to B4 and B5 or B6 is continued.

If it is determined that the transport stop criterion is met, the determination program 56 determines whether the abnormality-related inspection item is the same as the inspection item for which an abnormality, which has caused the stop of the operation of the unit block B5 or B6 in the steps S2, S3, has previously been detected (step S6). If the inspection items are determined to be the same in the step S6, then the determination program 56 determines whether the coating block which the wafer W, determined to be abnormal in the step S4, has passed through is identical to the coating block which the wafer W, determined to be abnormal in the step S1, has passed through (step S7).

If the coating blocks are determined to be identical in the step S7, the abnormality in the inspection item is considered to be due to the processing in the coating block. Accordingly, the processing of wafers W in the coating block and the operation of the main arm A are stopped. Thus, the processing of wafers W in one of the pair of unit groups B1 and B3 and the pair of unit groups B2 and B4 is stopped. Further, the transport program 55 rewrites the transport schedule so that processing of wafers will be carried out by using those unit blocks of the unit blocks B1 to B4 which are in operation. Wafers W are then transported and processed according to the revised transport schedule (step S8).

Figure 10:
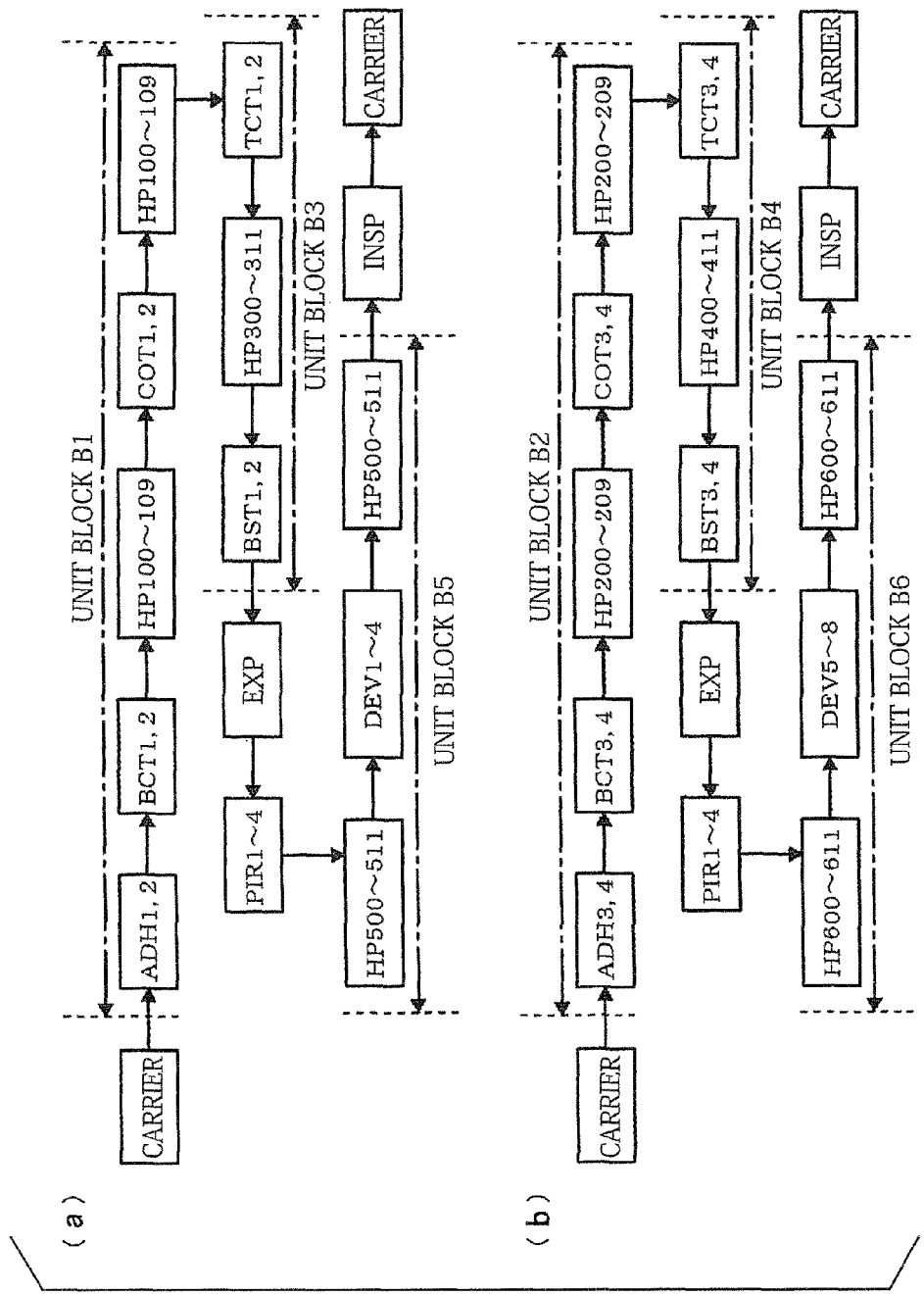
FIGS. 10(a) and 10(b) are diagrams illustrating wafer transport routes in the coating and developing apparatus.

For example, when, after wafer transport to the unit block B5 is stopped as shown in FIG. 12, an abnormality occurs repeatedly and frequently in the same inspection item as that upon the stop of wafer transport to the unit block B5, wafer transport to the unit blocks B1, B3 is stopped according to the procedures of the steps S6 to S8. All the wafers W are then transported along the route: the unit block B2→the unit block B4→the unit block B6, as shown in FIG. 10(*b*). If in the step S6 the abnormality-related inspection item is determined to be different from the previous abnormality-related inspection item upon the stop of the developing block, or if in the step S7 the coating blocks which respectively have processed the present and previous defective wafers are determined to be different, wafer transport to the unit blocks in operation is continued, and the inspection item which has been determined to meet the transport stop criterion in the step S5 is displayed on the display section 65 (step S9).

Mode D2

A description will now be given of the case where the inspection C2 after resist film formation is set and a mode D2 to stop wafer transport to an individual unit block is selected. A wafer W is transported along the following route during the implementation of the inspection C2 after resist film formation: The wafer W which has undergone resist film-forming processing and has been carried into the transfer module CPL4 or CPL6, is carried by the transfer arm 30 into the inspection module 31. After inspection in the inspection module 31, the wafer W is carried into the third or fourth unit block via the transfer module CPL7 or CPL9. The wafer W after development is transported in the order of the transfer module CPL13 or CPL15→the transfer module CPL0, and is returned to the carrier C. Except for such difference, the wafer W is transferred in the same manner as in the implementation of the inspection C1 after development.

Also in the mode D2, an abnormality in a wafer W is inspected for each inspection item as in the mode of inspection after development, and the processing of the steps S1 and S2 is executed. The processing is continued if it is determined that the transport stop criterion is not met in the step S2. If it is determined that the transport stop criterion is met, processing of wafers W is stopped in the processing modules of the unit block B1 or B2 which has carried out processing of a wafer W in which an abnormality has been detected, and the operation of the main arm A is also stopped. The transport program 55 rewrites the transport schedule so that processing of wafers will be carried out by using the unit block B1 or B2 in which the operations of the processing modules and the main arm A are not stopped.

Figure 13:
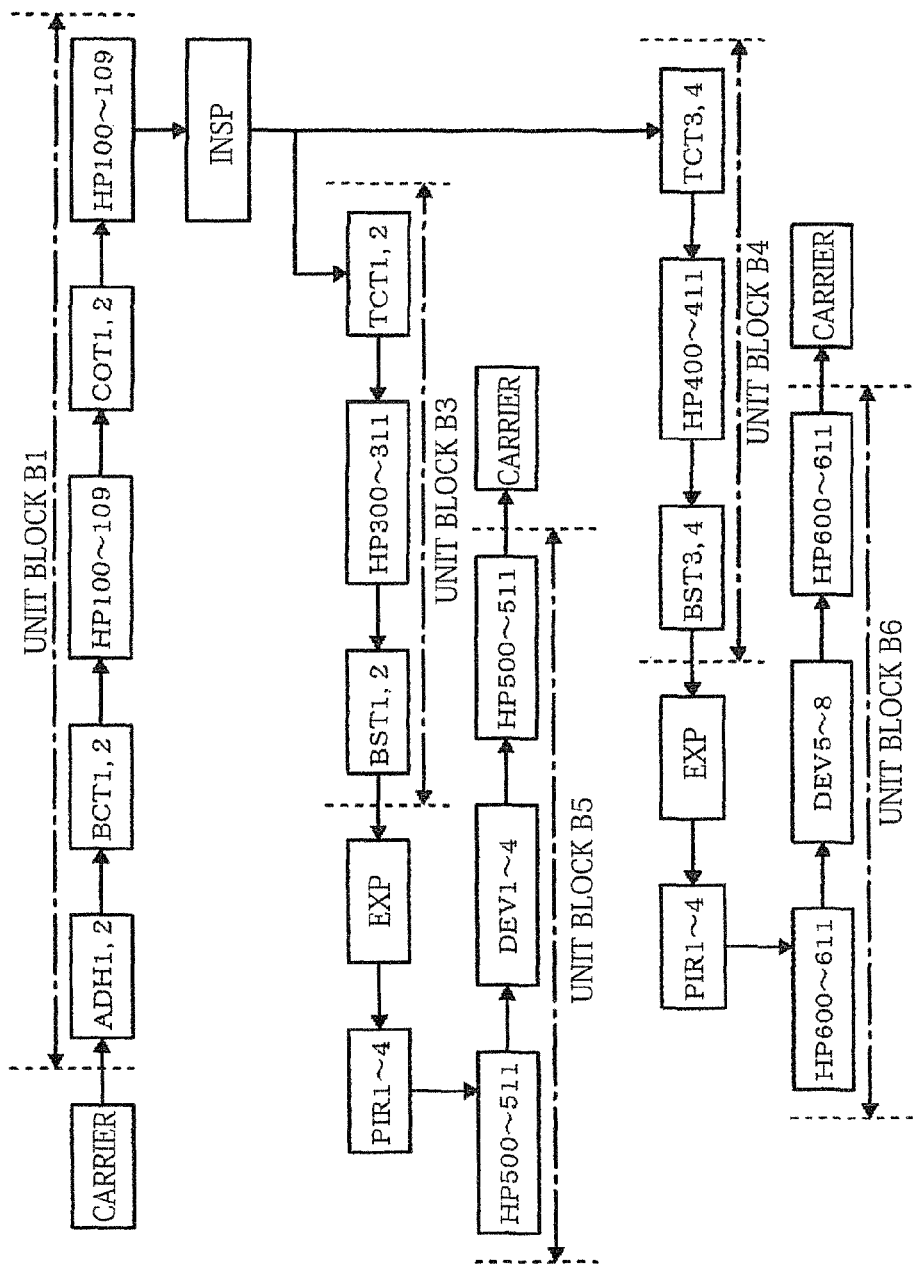
FIG. 13 is a diagram illustrating a wafer transport route upon detection of an abnormality.

FIG. 13 shows a transport route in the case where transport of wafers W to the second unit block B2 is stopped according to the above. As shown in the figure, subsequent wafers W are all carried from a carrier C into the first unit block B1. The wafers W are then directed from the first unit block B1 to one of the third and fourth unit blocks B3, B4. On the contrary, in the case where wafer transport to the first unit block B1 is stopped, subsequent wafers W are all carried from a carrier C into the second unit block B2.

Mode D3

Figure 14:
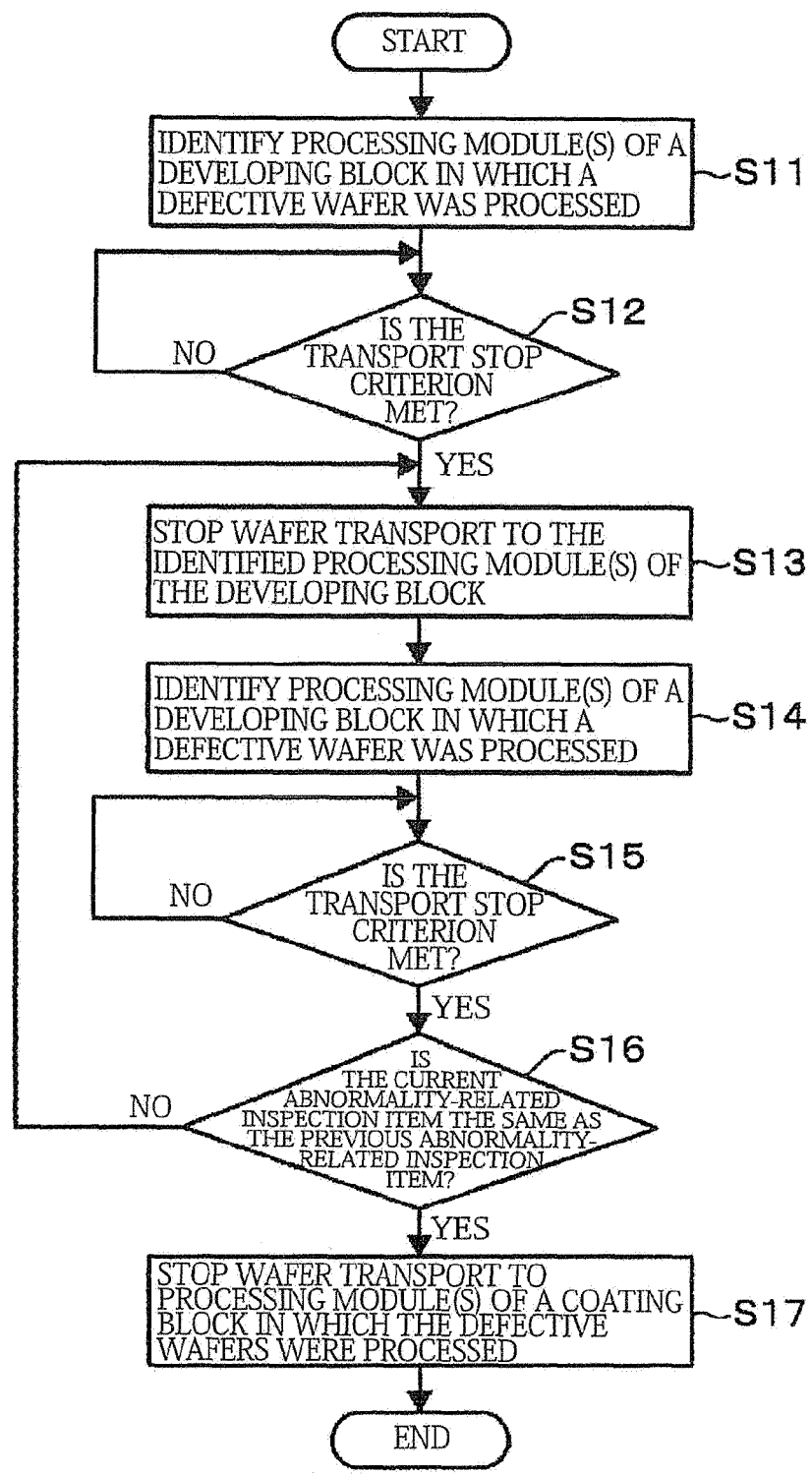
FIG. 14 is a flow chart illustrating the process of stopping transport of wafers to a processing module.

A description will now be given of the case where the inspection C1 after development is set and a mode D3 to stop wafer transport to an individual processing module is selected. A process flow during the implementation of the mode D3 will now be described with reference to FIG. 14, focusing on differences from the mode D1. Upon detection of an abnormality in a wafer W, the determination program 56, based on the transport schedule, identifies those processing modules of the unit blocks B5, B6 which have processed the defective wafer W. Further, the ID of the wafer, the abnormality-related inspection item and the identified processing modules are, in their relation, stored in the memory 61 (step S11). Subsequently, the determination program 56, based on data stored in the inspection results storage area 60 in the memory 61, determines if any of the processing modules meets the transport stop criterion (step S12).

If it is determined that none of the processing modules meets the transport stop criterion, transport of wafers W to the processing modules is continued. If there is a processing module which meets the transport stop criterion, processing of a wafer W in the processing module is stopped (step S13). A transport schedule is set to perform wafer transport except the stopped processing module, and transport and processing of wafers W are continued.

When an abnormality occurs later in a wafer W, the determination program 56 stores the ID of the wafer W, the abnormality-related inspection item, and those processing modules of the developing unit blocks B5, B6 which have processed the defective wafer W, in their relation, in the inspection results storage area 60 in the memory 61 (step S14) as in the step S11. Further, as in the step S12, the determination program 56, based on data stored in the inspection results storage area 60 in the memory 61, determines if any of the processing modules, identified in the step 14, meets the transport stop criterion (step S15).

When there is an inspection item which meets the transport stop criterion, the determination program 56 determines whether the inspection item is the same as the inspection item relevant to the determination, made in the step S13, to stop wafer transport to the processing module (step S16). If the inspection items are determined to be not the same, the processing in the step S13 and in the subsequent steps is executed, and wafer transport to a processing module which meets the transport stop criterion is stopped in the developing unit block.

If the inspection items are determined to be the same in the step S16, the determination program 56, based on the transport schedule, identifies a processing module which has processed the wafer W, in which the abnormality has been detected in the step S14, in the unit blocks B1 to B4. Processing of a wafer W in the identified processing module is stopped. A transport schedule is set to perform wafer transport except the stopped processing module, and transport and processing of wafers W are continued (step S17). The phrase "perform wafer transport except the stopped processing module" has the following meaning: A wafer W, which has been set to be transported to the stopped module in a unit block, is transported to another module which performs the same processing as the stopped module in the unit block. Thus, if processing of a heating module in a unit block is stopped, wafers W are transported to another heating module in the same unit block. If processing of a liquid processing module in a unit block is stopped, wafers W are transported to another liquid processing module which is provided in the same unit block and which performs the same processing as the stopped liquid processing module. Thus, except for not transporting wafers W to an unusable processing module, wafers W are transported in the mode D3 along the same route as in the case of absence of an abnormality in any unit block, i.e. the route shown in FIG. 10.

A supplementary description will now be given of a processing module to which wafer transport is to be stopped upon the implementation of the mode D3. For example, in the case where pattern collapse is detected in a wafer W in the step S11 and the wafer W has undergone processing in the developing module DEV1 and the heating module 500, a determination is made as to whether the developing module DEV1 meets the transport stop criterion by referring to the past inspection results for wafers W which have undergone processing in the developing module DEV1. Further, a determination is made as to whether the heating module 500 meets the transport stop criterion by referring to the past inspection results for wafers W which have undergone processing in the heating module 500. If one of the developing module DEV1 and the heating module 500 is determined to meet the transport stop criterion, wafer transport to that processing module is stopped. A determination as to whether to meet the transport stop criterion is thus made for each relevant processing module.

The pairs of the developing modules DEV1 and DEV2, the developing modules DEV3 and DEV4, the developing modules DEV5 and DEV6, and the developing modules DEV7 and DEV8 each share a nozzle 24. When a determination to stop wafer transport is made for one of a pair of developing modules DEV which share a nozzle 24, the determination involves stop of wafer transport to the other one of the pair. Thus, when wafer transport to the developing module DEV1 is stopped, then wafer transport to the developing module DEV2 is also stopped. If wafer transport to the developing modules DEV3, DEV4 is not stopped, wafers W that have transported to the unit block B5 are processed in the developing modules DEV3, DEV4 and returned to the carrier C as described above. When the heating module 500 meets the transport stop criterion, wafers W are transported to the other heating modules 501 to 511.

As regards the antireflection film-forming modules BCT1 to BCT4, the resist film-forming modules COT1 to COT4 and the protective film-forming modules TCT1 to TCT4, each pair of two liquid processing modules provided in each unit block shares one nozzle. Therefore, in order to prevent stop of processing in each unit block, wafer transport to these liquid processing modules is not stopped in the step S17. Instead, a liquid processing module which has processed a wafer W that meets the transport stop criterion in the step S15 and the relevant inspection item are, in their relation, displayed on the display section 65.

Mode D4

A description will now be given of the case where the inspection C2 after resist coating is set and a mode D4 to stop wafer transport to an individual processing module is selected. The following description will be focused on differences from the mode D3. During the implementation of the mode D4, transport of wafers W is performed in the same manner as in the mode D2. Thus, wafers W after processing in the unit block B1 or B2 are transported to the inspection module 31. When an abnormality is detected in a wafer W, as in the mode D3, processing modules which have processed the wafer W are identified, and a determination is made as to whether the transport stop criterion is met for each of the identified processing modules. If any identified processing module meets the transport stop criterion, wafer transport to the processing module is stopped. Because wafers W after resist coating are inspected in the mode D4, the processing module is one which belongs to either the unit block B1 or the unit block B2. Wafer transport to a processing module(s) is stopped based on the rule described above with reference to the mode D3. Thus, with reference to the antireflection film-forming modules BCT1 to BCT4 and the resist film-forming modules COT1 to COT4, even if any of these liquid processing modules meets the transport stop criterion, wafer transport to that processing module is continued.

In the coating and developing apparatus 1, the antireflection film-forming modules BCT1 to BCT4 and the resist film-forming modules COT1 to COT4 are disposed in the unit blocks B1, B2, and the protective film-forming modules TCT1 to TCT4 and the back surface cleaning modules BST1 to BST4 are disposed in the unit blocks B3, B4. With reference to the unit blocks B1 to B4, two unit blocks having the same construction (B1 and B2, B3 and B4) are doubled and vertically stacked. The developing unit blocks B5, B6, which are vertically doubled, are stacked on the unit blocks B1 to B4. This enables a small installation area of the processing block S2 while ensuring an appropriate depth dimension. To construct a "doubled unit block", it is only necessary to design the two unit blocks so that the blocks can perform the same processing; the layout and the number of modules need not necessarily be made the same between the two unit blocks.

During the implementation of the mode D1 or D2, even when an abnormality is detected in a wafer W, wafer transport to one unit block of a doubled unit block is continued though wafer transport to the other unit block is stopped. While processing of wafers W in the one unit block is continued, the user can perform maintenance of the other unit block, such as repair upon a failure, periodic inspection, check of adjustment, etc. This can reduce the lowering of the operation efficiency of the coating and developing apparatus 1.

By executing the stop of wafer transport to a developing unit and the stop of wafer transport to a coating block in a stepwise manner as described above, the stop of wafer transport to a coating block for which transport stop is unnecessary can be prevented. This can more securely reduce the lowering of the operation efficiency. The present invention, however, is not limited to such stepwise stop of wafer transport to unit blocks. For example, when a developing defect which is partly due to a coating step, such as pattern collapse or a locally abnormal line width, is detected in a wafer W, wafer transport to a developing block and a coating block which have processed the wafer W may be stopped simultaneously. This can reduce the risk of the occurrence of a defect in a wafer W. In the above case, when the mode of stopping a developing block is taken as mode E1 and the mode of stopping a coating block as mode E2 in the mode D1, the mode E2 is automatically implemented after the implementation of the mode E1. It is also possible for the user to select whether to implement the mode E2 via the setting section 64.

During the implementation of the mode D3 or D4, transport of wafers W to an individual processing module is stopped. This can reduce the number of processing modules whose operations are stopped, thereby further reducing the lowering of the operation efficiency of the apparatus. During the implementation of the mode D3, a processing module of a developing block and a processing module of a coating block may not necessarily be stopped stepwise. Thus, depending on the abnormality-related inspection item, wafer transport may be stopped for all the processing modules that have processed a wafer W in which an abnormality is detected. In the above case, when the mode of stopping a processing module of a developing block is taken as mode E3 and the mode of stopping a processing module of a coating block as mode E4 in the mode D3, the mode E4 is automatically implemented after the implementation of the mode E3. It is also possible for the user to select whether to implement the mode E4 via the setting section 64.

With reference to the liquid processing modules BCT1 to BCT4, COT1 to COT4, TCT1 to TCT4, BST1 to BST4 and DEV1 to DEV4, the stop of wafer transport may be controlled for an individual processing cup during the implementation of the mode D3 or D4. Thus, transport of wafers W to the processing cup 23 of a processing module which has processed a wafer W in which an abnormality has occurred is stopped, whereas transport of wafers W to that processing cup 23 which shares a nozzle 24 with the stopped processing cup 23 may be continued. Further, with reference to the liquid processing modules BCT1 to BCT4, COT1 to COT4, TCT1 to TCT4, BST1 to BST4 and DEV1 to DEV4, when it is determined to stop wafer transport to a particular liquid processing module, it is possible to stop wafer transport to the unit block that includes the liquid processing module instead of stopping wafer transport to the liquid processing module.

In the case of stopping transport of wafers W to an individual processing cup 23 as described above, in order to adjust the number of wafers W to be processed in the apparatus, the apparatus may be operated in the following manner: For example, when nonuse of the processing cup 23 of one of the antireflection film-forming modules (BCT1 to BCT4) is determined, it is possible to set the apparatus not to use the processing cup 23 of one of the resist film-forming modules (COT1 to COT4) which lies in the same unit block. Similarly, when nonuse of the processing cup 23 of one resist film film-forming module (one of COT1 to COT4) is determined, it is possible to set the apparatus not to use the processing cup 23 of one antireflection film-forming module (one of BCT1 to BCT4) which lies in the same unit block. Further, also in the unit block having the same construction as the unit block in which wafer transport to the processing cup 23 of one of the resist film-forming modules (COT1 to COT4) and to the processing cup 23 of one of the antireflection film-forming modules (BCT1 to BCT4) is thus stopped, it is possible to stop wafer transport to the processing cup 23 of one of the resist film-forming modules and to the processing cup 23 of one of the antireflection film-forming modules in order to adjust the number of wafers W to be processed.

Figure 15:
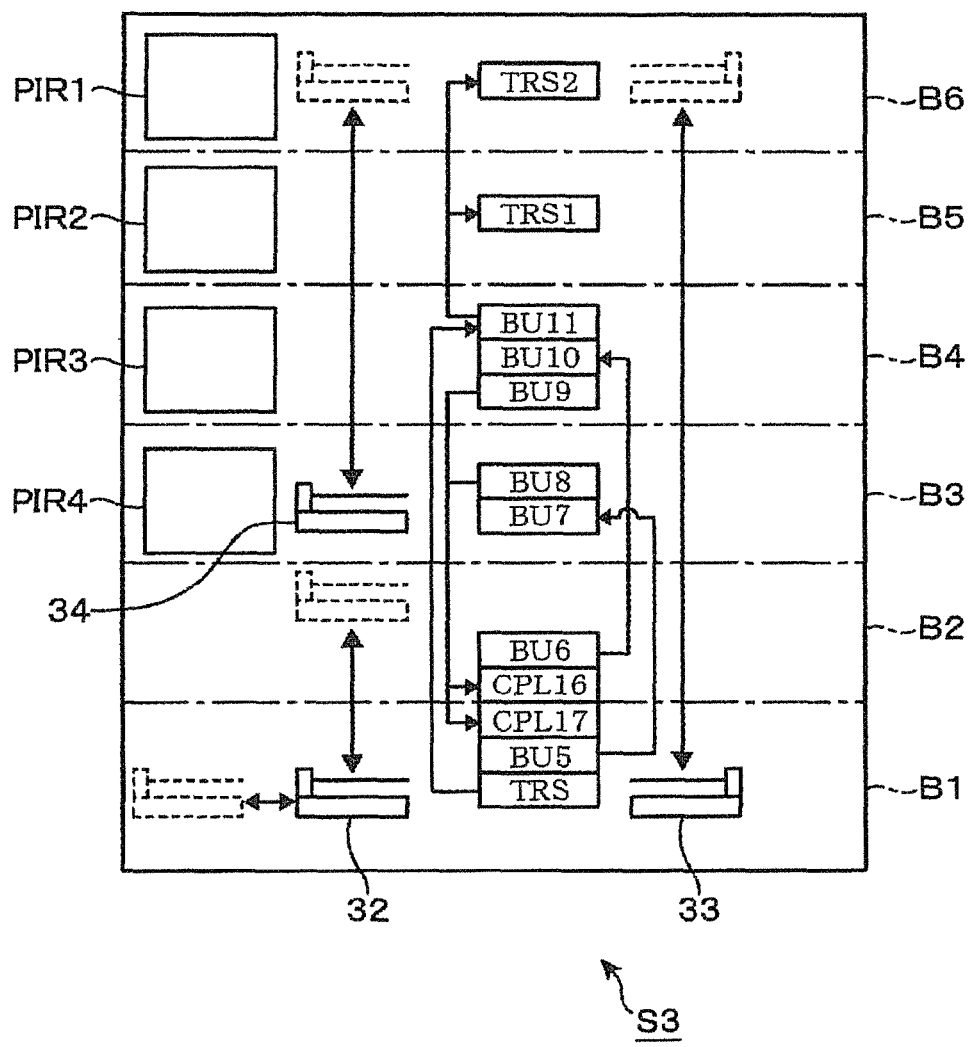
FIG. 15 is a vertical sectional front view of another interface block.

In the coating and developing apparatus 1, the interface block S3 may be constructed as shown in FIG. 15. In this embodiment wafers W are transported from the unit block B1 or B2 to the unit block B3 or B4 via the interface block S3. The interface block S3 shown in FIG. 15 differs from that shown in FIG. 5 in the following respects: Transfer modules BU5, BU6 are provided in height positions corresponding to the unit blocks B1, B2, respectively. Transfer modules BU7, BU8 are provided in height positions corresponding to the unit block B3. Transfer modules BU9-BU11 are provided in height positions corresponding to the unit block B4. Transfer modules TRS1, TRS2 are provided in height positions corresponding to the unit blocks B5, B6, respectively. The interface block S3 is also provided with a transfer module BU11. The transfer modules are stacked on top of each other.

A Wafer W after processing in the unit block B1 or B2 is transported to the transfer module BU5 or BU6, and then transported by the interface arm 33 to the transfer module BU7 or BU8. The wafer W is then carried by the transfer arm A3 or A4 into the unit block B3 or B4, where the wafer W is processed. The wafer W after processing is transported to the transfer module BU9 or BU10, and then transported by the interface arm 33 to the transfer module CPL16 or CPL17. Subsequently, as with the embodiment shown in FIG. 5, the wafer W is transported in the order of the exposure apparatus S4→the transfer module TRS. Thereafter, the wafer W is transported in the flowing order: the transfer module TRS→the interface arm 33→the transfer module BU11→the interface arm 34→one of the post-exposure cleaning modules PIR1 to PIR4→the interface arm 34→the transfer module TRS1 or TRS2. The wafer W is then transported by the main arm A5 or A6 to the unit block B5 or B6.

Figure 16:
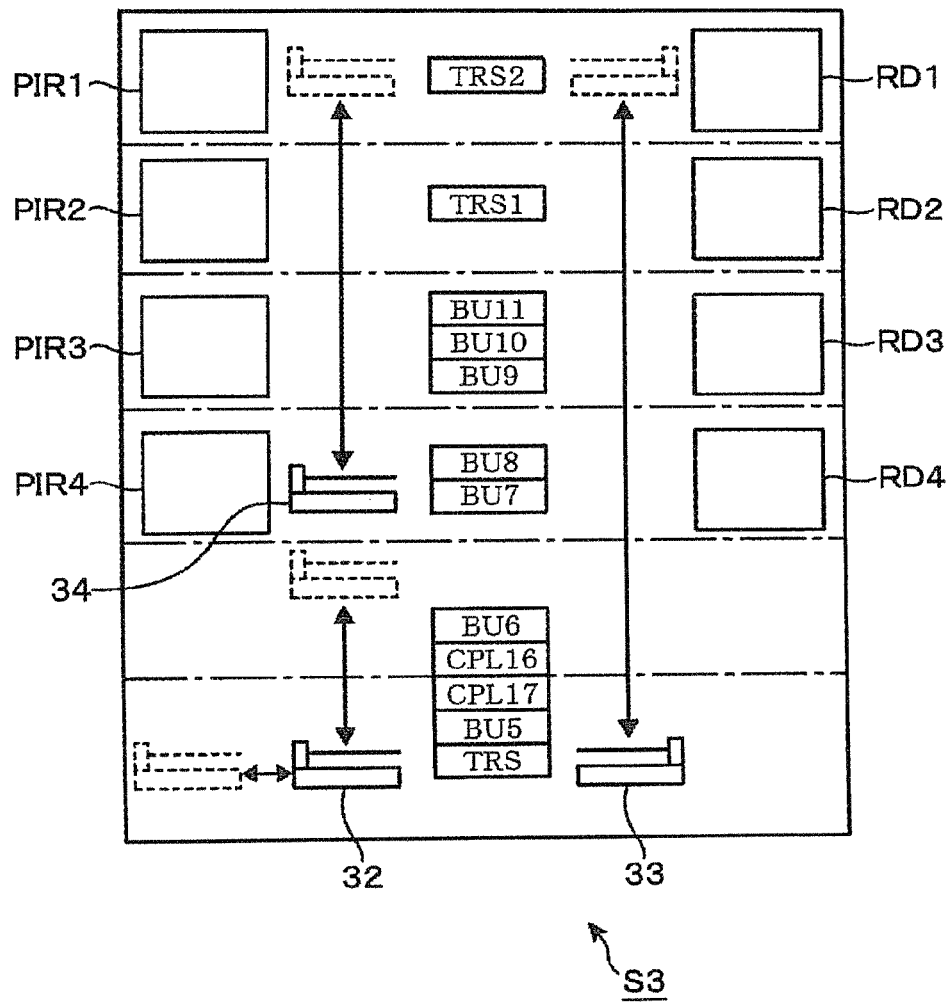
FIG. 16 is a vertical sectional front view of yet another interface block.

FIG. 16 shows the construction of yet another interface block S3. The interface block S3 of FIG. 16 is provided with a stack of pre-exposure cleaning modules RD1 to RD4. The pre-exposure cleaning modules RD1 to RD4 supply a cleaning liquid to the surface of a wafer W before exposure to rinse dissolved matter off the wafer surface. Except for the provision of the pre-exposure cleaning modules RD1 to RD4, the interface block S3 of FIG. 16 has the same construction as the interface block S3 of FIG. 15.

In the interface block S3 of FIG. 16, a wafer W which has been processed in the third unit block B3 or the fourth unit block B4 and has been transported to the transfer module BU9 or BU8, is transported by the interface arm 33 to one of the pre-exposure cleaning modules RD1 to RD4, where the wafer W is cleaned. Thereafter, the wafer W is transported in the order of the interface arm 33→the transfer module CPL14 or CPL15→the exposure apparatus S4. Such pre-exposure cleaning modules RD may be provided also in the interface block S3 of FIG. 5. In the above-described embodiments, transport of wafers W from the unit block B1 (B2) to the unit block B3 (B4) may be performed by the interface arm 33. More specifically, a transfer module which can receive a wafer W after coating is provided in the shelf unit U8 at a position corresponding to the unit block B1 (B2). A wafer W can be transported from the unit block B1 (B2) to the unit block B3 (B4) by transferring the wafer W by the interface arm 33 from the transfer module to that support portion 43 in the transfer module BU4 of the shelf unit U8 which lies in a height position corresponding to the unit block B3 (B4).

In the above described embodiments, wafers W after processing in the protective film-forming modules TCT1 to TCT4 and heating in the heating modules HP300 to HP311 or HP400 to HP411, may be transported to the inspection module 31 for inspection of the wafers W. In that case, according to the procedures of the above-described modes, wafer transport may be stopped either for a unit block in which an antireflection film, a resist film and a protective film have been formed on a wafer W in which an abnormality has been detected or for a processing module belonging to the unit block and which has processed the defective wafer W.

In the foregoing embodiments, instead of the protective film-forming modules TCT1 to TCT4, it is possible to provide modules for forming an antireflection film (as an upper film) over a resist film. Instead of carrying out hydrophobizing processing of wafers in the hydrophobizing modules ADH before the formation of an antireflection film in the antireflection film-forming modules BCT, it is possible to carry out the hydrophobizing processing after the formation of the antireflection film and before resist coating, or after resist coating and before transport of the wafers to the unit blocks B3, B4. The order of stacking of the unit blocks is not limited to that described above. For example, the fifth and sixth unit blocks for performing developing processing may be provided under the first and second unit blocks for forming a resist film. Further, though in the above-described embodiments the unit blocks of each doubled unit block have the same number of modules and the same layout, the number of modules and the layout may not necessarily be the same between the unit blocks insofar as the same processing can be performed for wafers W.

In the coating and developing apparatus 1, during processing of wafers W in any of the above-described modes, the mode being implemented can be switched to a maintenance mode at an arbitrary time. When a user performs predetermined processing e.g. via the setting section 64, a switch signal is outputted to various components of the apparatus 1, and the maintenance mode starts. In an exemplary manner of maintenance, one unit block of a doubled unit block is subjected to maintenance. For example, one of the unit blocks B1, B2 for the early-stage processing steps of the sequence of coating steps may be subjected to maintenance. Alternatively, one of the unit blocks B3, B4 for the later-stage processing steps of the sequence of coating steps may be subjected to maintenance. Alternatively, one of the unit blocks B5, B6 for developing processing may be subjected to maintenance. To perform such a manner of maintenance, information on the execution of maintenance of the unit block B1, for example, is inputted into the control section. Then transport of wafers is controlled such that wafers are not transported to the unit block B1. In the above-described embodiment, the route shown in FIG. 10(a) and the route shown in FIG. 10(b) are provided for transport of wafers. Not to transport wafers to the unit block B1 means not to use the route shown in FIG. 10(a). Accordingly, wafers will not be transported to the hydrophobizing modules ADH1, ADH2 and the unit blocks B3 and B5, included in the route shown in FIG. 10(a).

In the maintenance mode, regardless of the results of inspection for wafers W, the user specifies a unit block to which transport of wafers W is to be stopped, so that processing of wafers W is continued in those unit blocks to which wafer transport is not stopped. By thus using doubled unit blocks and not using a transport route including a unit block being subjected to maintenance, processing involving control of wafer transport can be simplified.

The maintenance mode is not limited to the method of not using a transport route including a unit block being subjected to maintenance. For example, when simultaneously performing maintenance of the block B1 included in the route shown in FIG. 10(a) and maintenance of the block B4 included in the route shown in FIG. 10(b), it is efficient to use the unit block B2 included in the route shown in FIG. 10(b) and the unit block B3 included in the route shown in FIG. 10(a). In this case, processing of wafers is performed by using the combination of the usable unit blocks of the doubled unit blocks. Also in this case, the apparatus can be operated while preforming maintenance and without a significant lowering of the operating rate.

Further, in the maintenance mode, when one of a doubled unit block, e.g. the block B1 for the early-stage processing steps, is being subjected to maintenance, wafers may be transported to the other unit blocks than the unit block B1. Thus, the unit blocks B3 and B4 for the later-stage processing steps may be operated, and wafers after processing in the unit block B2 for the early-stage processing steps may be directed to the unit block B3 or B4. The unit blocks B5, B6 for developing processing may also be operated.

The following is a description of other embodiments of the present invention. FIG. 17 shows another example of the processing block S2. In FIG. 17, the rows from the bottom to the top respectively correspond to the blocks B1 to B6 shown in FIG. 4, and each square represents a liquid processing module such as an antireflection film-forming module BCT1. With reference to the unit blocks B1, B2, B5 and B6, the processing block S2 of FIG. 17 has the same construction as the processing block S2 shown in FIG. 4. Thus, the unit block B1 of this example, in a plane view, is as shown in FIG. 1. The processing block S2 of FIG. 17 differs from that of FIG. 4 in that the back surface cleaning modules BST1 to BST4 are not provided in the unit blocks B3, B4 of this example.

Figure 18:
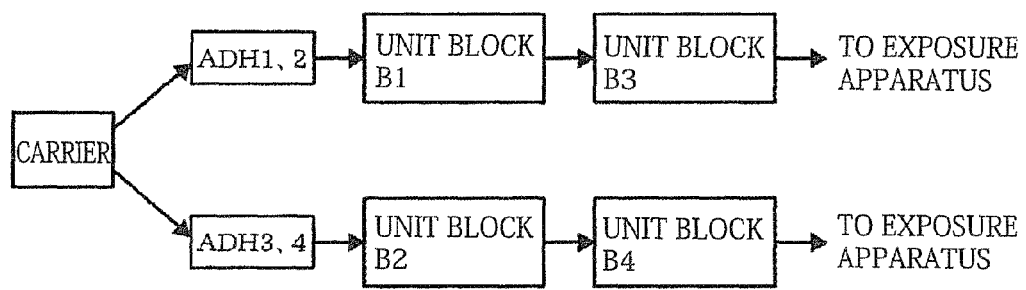
FIG. 18 is a diagram illustrating a wafer transport route in the case of using the processing block shown in FIG. 17.

FIG. 18 schematically shows a wafer transport route for the formation of a coating film, excerpted from the wafer transport routes shown in FIGS. 10(a) and 10(b). According to the embodiment shown in FIG. 18, a wafer taken out of a carrier C is transported to coating film-forming unit blocks via one of the hydrophobizing modules ADH1 to ADH4. The coating film-forming unit blocks are separated into the unit block B1 (B2) for the early-stage processing steps of the sequence of coating steps and the unit block B3 (B4) for the later-stage processing steps. The resist film-forming modules COT1, COT2 (COT3, COT4) are provided in the unit block B1 (B2) for the early-stage processing steps (early-stage processing unit block). However, the resist film-forming modules COT1, COT2 (COT3, COT4) may be disposed in the unit block B3 (B4) for the later-stage processing steps.

Figure 4:
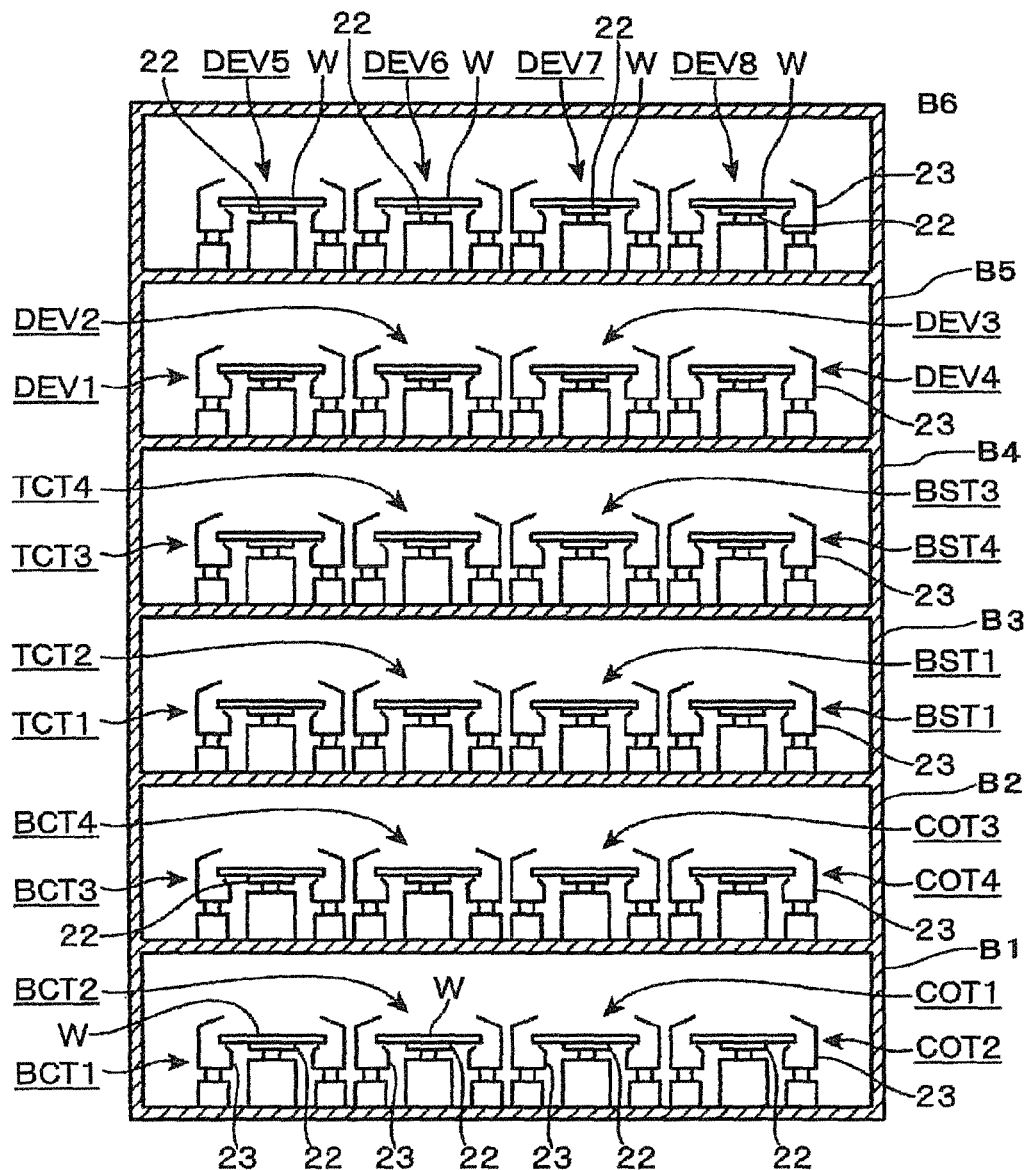
FIG. 4 is a vertical sectional side view of the processing block of the coating and developing apparatus.

FIG. 19 shows an exemplary layout of processing modules in such a processing block S2. In FIG. 19, the rows and the squares have the same meanings as in FIG. 17. In this example, the resist film-forming modules COT1, COT2 and the protective film-forming modules TCT1, TCT2 for forming an upper-layer protective film are provided in the unit block B3 for the later-stage processing steps, and the resist film-forming modules COT3, COT4 and the protective film-forming modules TCT3, TCT4 are provided in the unit block B4 for the later-stage processing steps, while those spaces in the unit blocks B1, B2 which correspond to the spaces where the resist film-forming modules COT1 to COT4 are provided in the layout of FIG. 4, are made empty spaces. It is also possible to use a layout in which the resist film-forming modules COT1, COT2, COT3 and COT4 are provided in the unit blocks B1, B2, B3 and B4, respectively. In this case, the resist film-forming modules are distributed to the unit block B1 (B2) for the early-stage processing steps and the unit block B3 (B4) for the later-stage processing steps.

As shown in FIG. 20, the processing block S2 may be provided with inspection modules (INSP) 701 to 704 in the unit blocks B3, B4 for the later-stage processing steps (later-stage processing unit blocks). The layout of FIG. 20 is the same as the layout of FIG. 4 except that the inspection modules 701 to 704 are provided instead of the back surface cleaning modules BST1 to BST4. The inspection modules 701 to 704 are to inspect the coating state of a coating surface of a wafer W after the formation of a protective film on the wafer W in one of the protective film-forming modules TCT1 to TCT4, and to detect a defect (abnormality) in the coating. Examples of the defect include uneven film thickness, streaks in the coating film, poor or no coating, etc. In the case of no coating defect, it may be caused by an abnormality in a nozzle, a coating solution ejection pump or a piping system.

When an abnormality in a wafer W is determined upon inspection in one of the inspection modules 701 to 704, a module (a liquid processing module or a heating module) in which the wafer W has been processed may be stopped while continuing to use the other modules. Alternatively, the entire coating film-forming unit block in which the wafer W has been processed may be stopped while continuing the operation of the other unit blocks. Selection between a mode to stop a module and a mode to stop a unit block may be made e.g. by setting the mode in the control section.

Though in the foregoing embodiments the coating film-forming unit blocks for the early-stage processing steps and the coating film-forming unit blocks for the later-stage processing steps are each doubled, i.e. stacked in two layers, the unit blocks may be tripled or quadrupled, or N-folded (N is an integer greater than 2). The developing unit blocks may also be tripled or quadrupled. Further, instead of separately providing a coating unit block for the early-stage processing steps and a coating unit block for the later-stage processing steps as in the above-described embodiments, it is possible to use a unified unit block capable of performing a sequence of processing steps for the formation of intended coating films. FIG. 21 shows a layout of processing modules in such a processing block S2. In this example, antireflection film-forming modules and resist film-forming modules are disposed in the same unit block, and such unit blocks are tripled, i.e. stacked in three layers. The layout of FIG. 21 is the same as the layout shown in FIG. 4 when the unit blocks B3, B4 for the later-stage processing steps, provided with the protective-film forming modules, are deleted from the latter layout, and instead a unit block, having the same construction as the unit blocks B1, B2 for the later-stage processing steps, is stacked on the unit blocks and, in addition, the developing unit blocks are tripled, i.e. stacked in three layers. In FIG. 21, the number after the symbol B indicates what number unit block is the unit block counting from the lowest one in the block stack.

The foregoing embodiments generally enable small installation area of the processing block while ensuring an appropriate depth dimension. Further, the use of an N-folded unit block has the advantage that when one unit block of the N-folded unit block is unusable because of its maintenance or the occurrence of an abnormality in it, it is possible to use the other unit block(s). This can reduce the lowering of the operation efficiency of the coating and developing apparatus.

What is claimed:

1. A coating and developing system that: transfers a substrate, which has been loaded to a carrier block by a carrier, to a processing block; transfers, after a coating film including a resist film is formed on the substrate, the substrate to an exposure apparatus through an interface block which is located on a side of the processing block opposite to the carrier block; develops the substrate, which has been exposed and returned through the interface block in the processing block; and transfers the substrate to the carrier block, wherein:

(a) the processing block includes:
  a coating treatment stack comprising coating treatment unit blocks vertically stacked on each other, each of the coating treatment unit blocks including: a liquid treatment module that supplies a chemical liquid for forming the coating film onto the substrate; a heating module that heats the substrate after being coated with the chemical liquid; a unit block transfer mechanism that moves on a linear transfer path connecting the carrier block and the interface block to transfer the substrates between those modules; and
  a developing treatment stack comprising developing treatment unit blocks vertically stacked on each other, each of the developing treatment unit blocks including: a liquid treatment module that supplies a developing liquid onto the substrate; a heating module that heats the substrate; a unit block transfer mechanism that moves on a linear transfer path connecting the carrier block and the interface block;

(b) the interface block is located adjacent to the processing block and includes: a first transfer mechanism that is turnable in horizontal directions and is also movable forward and backward in horizontal directions, and that moves vertically to transfer the substrate; a second transfer mechanism that is turnable in horizontal directions and is also movable forward and backward in horizontal directions, and that moves vertically to transfer the substrate; a third transfer mechanism that transfers the substrate to and from the exposure apparatus; and a vertically multi-staged transition part located in an area across which the first and second transfer mechanisms face each other;

(c) a control unit is provided to control transferring of the substrate;

the transition part is configured to allow the substrate to be transferred to and from the first transfer mechanism, configured to allow the substrate to be transferred to and from the second transfer mechanism, and configured to allow the substrate to be transferred to and from the unit block transfer mechanisms at positions where the transition part is adjacent to the unit blocks, and a portion of the transition part is configured to allow the substrate to be transferred to and from the third transfer mechanism.

2. The coating and developing system according to claim 1, wherein said portion of the transition part has a cooling stage, and wherein the control unit is configured to control operation of said coating and developing system such that a substrate having been transferred to said portion of the transition part is cooled by the cooling plate before the substrate is transferred to the exposure apparatus, and then the substrate is received by the third transfer mechanism, and then is transferred to the exposure apparatus.

3. The coating and developing system according to claim 1, wherein the coating treatment stack includes: a resist film forming unit block having a resist coating module that applies a resist solution to form a resist film; and an upper layer film forming unit block having an upper layer film coating module; and wherein the control unit is configured to control operation of said coating and developing system such that a substrate having been processed by the resist coating module is transferred into a portion of the transition part corresponding to the resist film forming unit block, and then the substrate is transferred by the first or second transfer mechanism into a portion of the transition part corresponding to the upper layer film forming unit block, and then the substrate is received by the transfer mechanism of the upper layer film forming unit block and to be transferred into the upper layer film forming unit block to be processed therein.

4. The coating and developing system according to claim 1, wherein, in the interface module, the first transfer mechanism is positioned between the transition part and cleaning modules and the second transfer mechanism is positioned between the transition part and cleaning modules.

5. The coating and developing system according to claim 4, wherein the cleaning modules into which substrates are transferred by the first transfer mechanism are pre-exposure cleaning modules, while the cleaning modules into which substrates are transferred by the second transfer mechanism are post-exposure cleaning modules.

6. A coating and developing system that: transfers a substrate, which has been loaded to a carrier block by a carrier, to a processing block; transfers, after a coating film including a resist film is formed on the substrate, the substrate to an exposure apparatus through an interface block which is located on a side of the processing block opposite to the carrier block; develops the substrate, which has been exposed and returned through the interface block in the processing block; and transfers the substrate to the carrier block, wherein;

(a) the processing block includes:

a coating treatment stack comprising a plurality of coating treatment unit blocks vertically stacked on each other, each of the coating treatment unit blocks including: a liquid treatment module that supplies a chemical liquid for forming the coating film onto the substrate; a heating module that heats the substrate after being coated with the chemical liquid; a unit block transfer mechanism that moves on a linear transfer path connecting the carrier block and the interface block to transfer the substrates between those modules; and a developing treatment stack comprising a plurality of developing treatment unit blocks vertically stacked on each other, the developing treatment stack and the coating treatment stack being vertically stacked on each other, each of the developing treatment unit blocks including: a liquid treatment module that supplies a developing liquid onto the substrate; a heating module that heats the substrate; a unit block transfer mechanism that moves on a linear transfer path connecting the carrier block and the interface block;

(b) the interface block is positioned on an exposure apparatus side of the processing block and includes:

a transition unit stack comprising a plurality of transition units arranged in a vertical direction in a multi-staged manner;

a first transfer mechanism that moves vertically to transfer the substrate between the transition units;

a second transfer mechanism that moves vertically to transfer the substrate between the transition units, the transition unit stack is positioned between the second transfer mechanism and the first transfer mechanism in a lateral direction; and a third transfer mechanism that transfers the substrate between the transition unit stack and the exposure apparatus, wherein the transition units in the transition unit stack contains transition units for the exposure apparatus, to and from each of which the third transfer mechanism transfers the substrate, and also contains transition units for the unit blocks, to and from each of which the substrate is transferred by the unit block transfer mechanism of the corresponding unit block; and (c) said coating and developing system further includes a control unit for controlling transferring of the substrate in the carrier block, the processing block and the interface block.

7. The coating and developing system according to claim 6, wherein transition units for the exposure apparatus each includes a cooling stage, and wherein the control unit is configured to control transferring of the substrate in the interface block such that the substrate having been transferred from the unit block transfer mechanism of the coating treatment unit block to the corresponding transition unit is cooled by the corresponding cooling stage, and then transferred to the exposure apparatus.

8. The coating and developing system according to claim 6, wherein the coating treatment unit blocks constituting the coating treatment stack includes, as the liquid treatment module:

a resist film forming unit block having a resist coating module that applies a resist solution to form a resist film; and an upper layer film forming unit block having an upper layer film coating module, the resist film forming unit block and the upper layer film forming unit block are vertically stacked on each other;

wherein the control unit is configured to control the transferring of the substrate such that:

the substrate having been treated by the resist coating module of the resist coating unit block is transferred to a transition unit for unit block corresponding to the resist coating unit block;

thereafter, the substrate is transferred by the first or second transfer mechanism to the transition unit for unit block corresponding to the upper layer film forming unit block; and thereafter, from the transition unit for unit block corresponding to the upper layer film forming unit block, the substrate is transferred by the unit block transfer mechanism of the upper layer film forming unit block to the upper layer film forming unit block for formation of the upper layer film.

9. The coating and developing system according to claim 6, wherein the interface block includes first cleaning modules and second cleaning modules each for cleaning the substrate, and wherein, as viewed from a transition unit stack, the first cleaning modules are positioned behind the first transfer mechanism to allow the substrate to be transferred to and from the first cleaning modules by the first transfer mechanism, and second cleaning modules are positioned behind the second transfer mechanism to allow the substrate to be transferred to and from the second cleaning modules by the second transfer mechanism.

10. The coating and developing system according to claim 9, the first cleaning modules are cleaning modules that cleans the substrate before exposure, and the second cleaning modules are cleaning modules that cleans the substrate after exposure.

* * * * *